(12) United States Patent  
Kim et al.

(10) Patent No.: US 8,665,643 B2
(45) Date of Patent: Mar. 4, 2014

(54) NON-VOLATILE MEMORY DEVICE AND READ METHOD THEREOF

(75) Inventors: Tae-Young Kim, Seoul (KR); Jongsun Sel, Seoul (KR); Kitae Park, Seongnam-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 50 days.

(21) Appl. No.: 13/416,038

(22) Filed: Mar. 9, 2012

(65) Prior Publication Data

US 2012/0230104 A1  Sep. 13, 2012

(30) Foreign Application Priority Data

Mar. 10, 2011 (KR) .................. 10-2011-0021434

(51) Int. Cl.
*G11C 16/04* (2006.01)
(52) U.S. Cl.
CPC .................. *G11C 16/0483* (2013.01)
USPC ............ 365/185.05; 365/185.03; 365/185.12; 365/185.09; 365/189.04; 365/189.05
(58) Field of Classification Search
CPC ........... G11C 11/5628; G11C 16/0483; G11C 16/10; G11C 16/34; G11C 16/3454; G11C 2211/5621; G11C 2211/565
USPC ............ 365/185.03, 185.05, 185.12, 185.09, 365/189.04, 189.05
See application file for complete search history.

(56) References Cited

U.S. PATENT DOCUMENTS

| 7,237,074 | B2 | 6/2007 | Guterman et al. |
| 7,518,923 | B2 | 4/2009 | Mokhlesi |
| 7,542,350 | B2 | 6/2009 | Park et al. |
| 2008/0235480 | A1 * | 9/2008 | Traister ..................... 711/167 |

FOREIGN PATENT DOCUMENTS

| JP | 2007500918 | 1/2007 |
| JP | 2010515203 | 5/2010 |
| KR | 1020060025551 | 3/2006 |
| KR | 10-0830580 | 5/2008 |
| KR | 1020090117713 | 11/2009 |

* cited by examiner

*Primary Examiner* — Thong Q Le
(74) *Attorney, Agent, or Firm* — Stanzione & Kim, LLP

(57) ABSTRACT

Disclosed is a non-volatile memory device which includes a memory cell array having memory cells arranged in rows and columns, a page buffer circuit configured to read data from the memory cell array, and a control logic and input/output interface block including a normal read scheduler controlling a normal read operation and a data recover read scheduler controlling a data recover read operation and configured to control the page buffer circuit at a read request. One of the normal read scheduler and the data recover read scheduler is selected according to selection information provided from an external device.

50 Claims, 30 Drawing Sheets

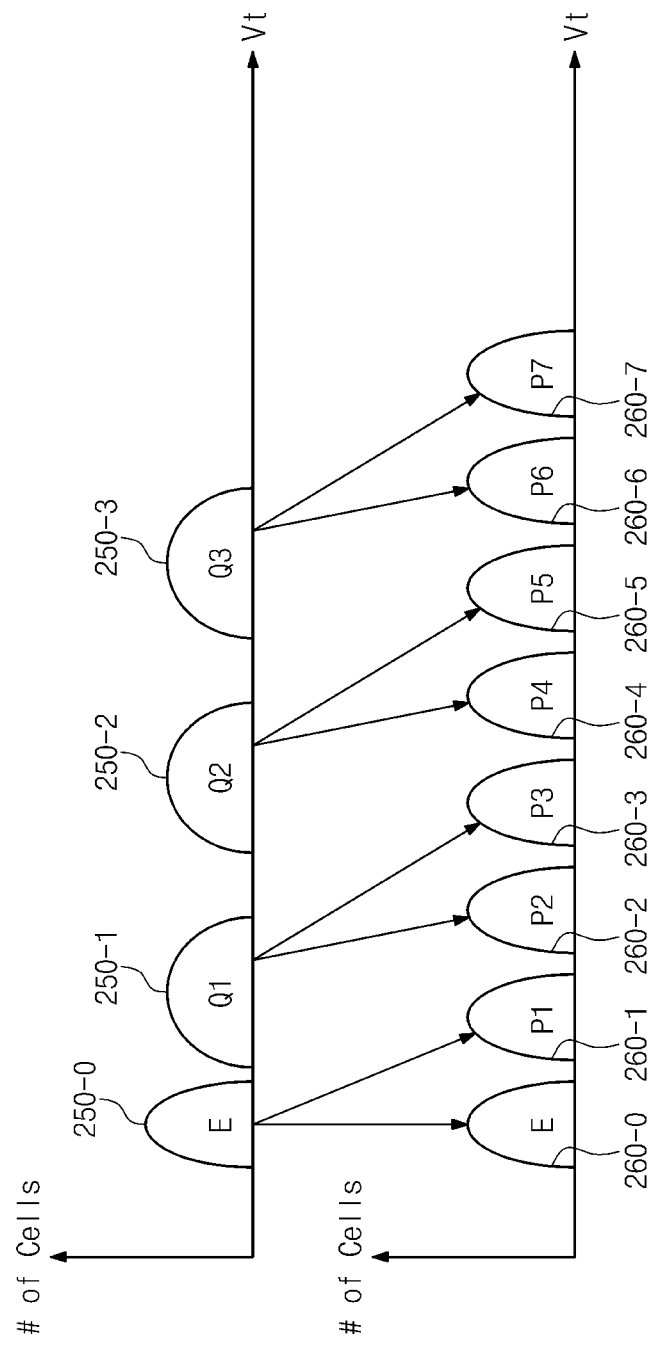

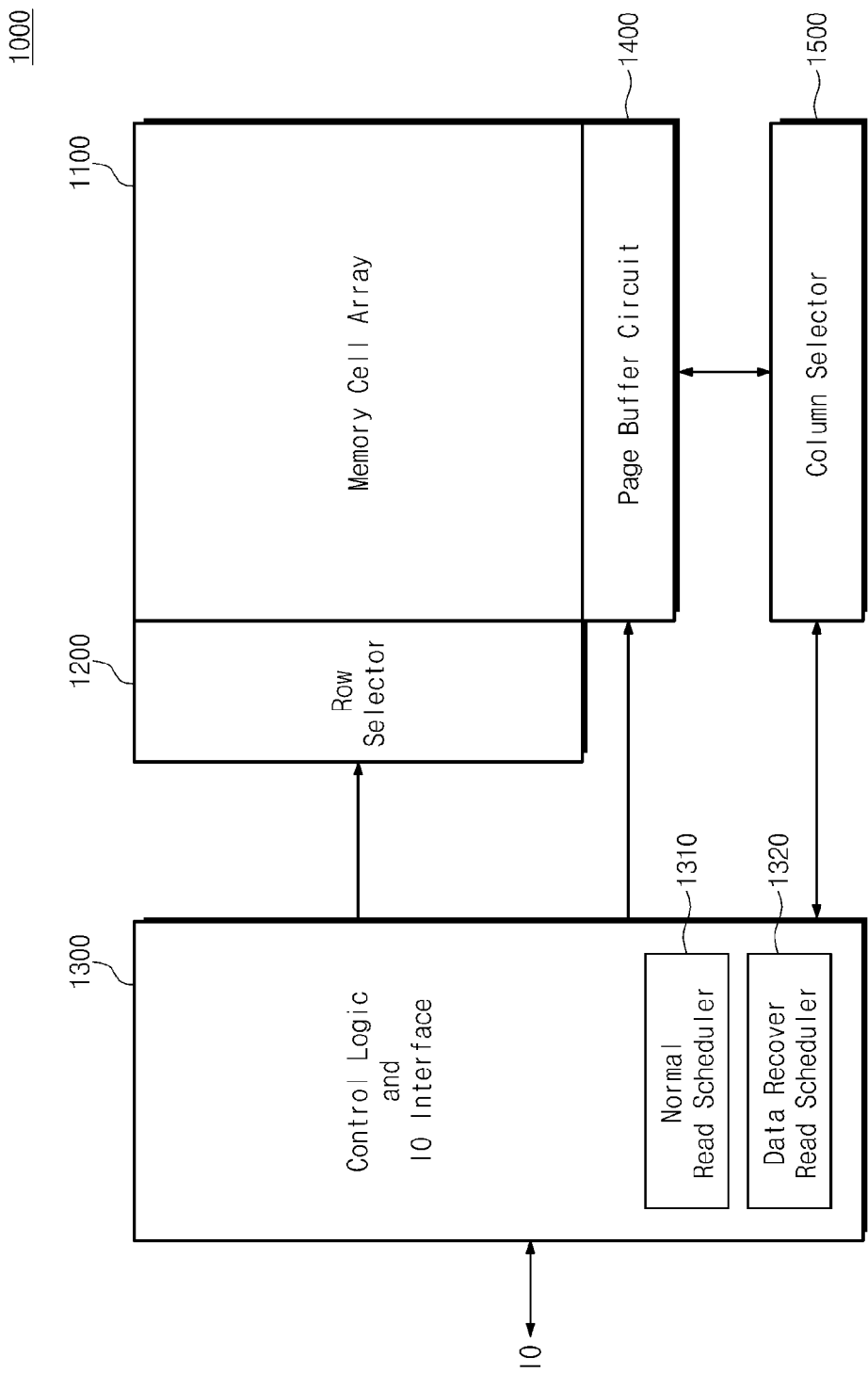

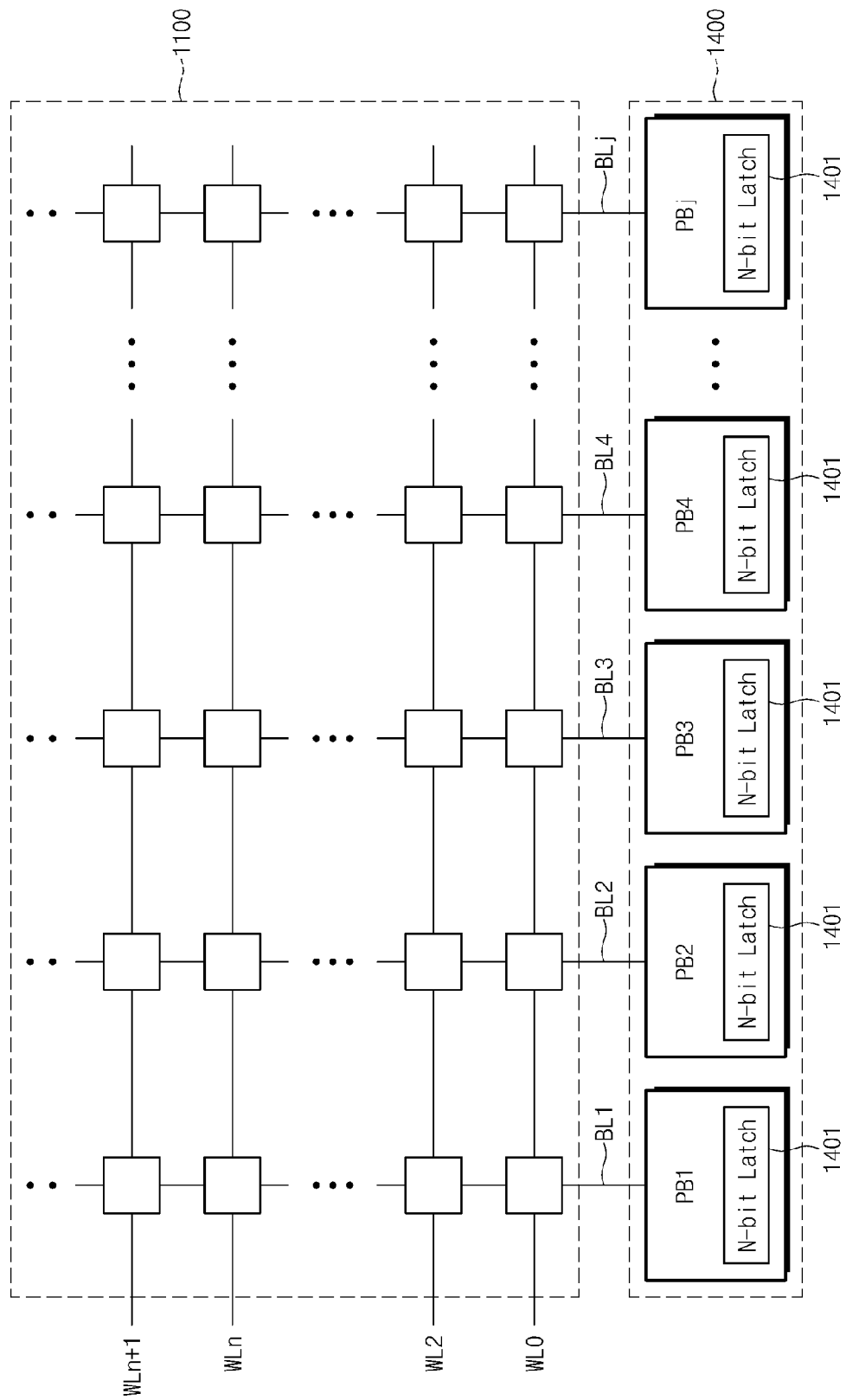

NON-VOLATILE MEMORY DEVICE AND READ METHOD THEREOF

CROSS-REFERENCE TO RELATED APPLICATIONS

This application claims priority under 35 U.S.C §119 from Korean Patent Application No. 10-2011-0021434 filed Mar. 10, 2011 in the Korean Intellectual Property Office, the disclosure of which is incorporated herein by reference in its entirety.

BACKGROUND

1. Field of the General Inventive Concept

Exemplary embodiments relate to an electronic device, and more particularly, relate to a memory system.

2. Description of the Related Art

Semiconductor memories are usually considered to be the most vital microelectronic component of digital logic system design, such as computers and microprocessor-based applications ranging from satellites to consumer electronics. Therefore, advances in the fabrication of semiconductor memories including process enhancements and technology developments through the scaling for higher densities and faster speeds help establish performance standards for other digital logic families.

Semiconductor memory devices may be characterized as volatile random access memories (RAMs), or non-volatile memory devices. In RAMs, the logic information is stored either by setting up the logic state of a bistable flip-flop such as in a static random access memory (SRAM), or through the charging of a capacitor as in a dynamic random access memory (DRAM). In either case, data is stored and can be read out as long as power is applied, and data is lost when power is turned off. Hence, these types of memories are called volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of storing data, even with power turned off. A non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvS-RAM) for use in systems that require fast, programmable non-volatile memory. In addition, dozens of special memory architectures have evolved which contain some additional logic circuitry to optimize their performance for application-specific tasks.

In non-volatile memories, however, MROM, PROM, and EPROM are not free to be erased and written to by a system itself, so that it is not easy for general users to update stored contents. On the other hand, EEPROM is capable of being electrically erased or written. Application of the EEPROM is widened to an auxiliary memory or to system programming where continuous updates are needed (flash EEPROM).

SUMMARY OF THE INVENTION

Features and utilities of the present general inventive concept will be set forth in part in the description which follows and, in part, will be obvious from the description, or may be learned by practice of the general inventive concept Embodiments of the present general inventive concept may be achieved by providing a non-volatile memory device which includes a memory cell array having memory cells arranged in rows and columns, a page buffer circuit configured to read data from the memory cell array, and a control logic and input/output interface block including a normal read scheduler controlling a normal read operation and a data recover read scheduler controlling a data recover read operation and configured to control the page buffer circuit at a read request, wherein one of the normal read scheduler and the data recover read scheduler is selected according to selection information provided from an external device.

In this embodiment, selecting of one of the normal read scheduler and the data recover read scheduler is made in an on-the-fly manner at power-up.

In this embodiment, the page buffer circuit includes a plurality of page buffers each corresponding to the columns of the memory cell array, and each of the page buffers includes an N-bit latch (N being an integer of 1 or more) which is set according to data read out from memory cells in a row adjacent to a read-requested row at the data recover read operation.

In this embodiment, the memory cells in the adjacent row include aggressor cells forcing word line coupling to memory cells in the read-requested row, the aggressor cells constituting one or more aggressor cell groups.

In this embodiment, each of the memory cells stores 3-bit data and is programmed to have one of an erase state and a first to a seventh program state.

In this embodiment, memory cells having the first, third, fifth and seventh program states among the memory cells in the adjacent row constitute a group of aggressor cells forcing word line coupling to the memory cells in the selected row.

In this embodiment, N-bit latches of page buffers corresponding to first memory cells in the group of aggressor cells among the memory cells of the adjacent row are set to a first logic state according to data read from the first memory cells, and N-bit latches of page buffers corresponding to second memory cells among the memory cells of the adjacent row are set to a second logic state according to data read from the second memory cells.

In this embodiment, memory cells having the first program state as the lowest program state among the memory cells of the adjacent row constitute a first aggressor cell group forcing word line coupling to the memory cells of the selected row at the data recover read operation, and memory cells having the second to seventh program states among the memory cells of the adjacent row constitute a second aggressor cell group forcing word line coupling to the memory cells of the selected row at the data recover read operation.

In this embodiment, N-bit latches of page buffers corresponding to first memory cells in the first aggressor cell group among the memory cells of the adjacent row are set to a first logic state according to data read from the first memory cells, N-bit latches of page buffers corresponding to second memory cells in the second aggressor cell group among the memory cells of the adjacent row are set to a second logic state according to data read from the second memory cells, and N-bit latches of page buffers corresponding to the remaining memory cells among the memory cells of the adjacent row are set to a second logic state according to data read from the remaining memory cells Embodiments of the present general inventive concept may also be achieved by providing a non-volatile memory device which includes a memory cell array having memory cells arranged in rows and columns and programmed to have one of an erase state and a first to a seventh program state, a page buffer circuit configured to read data from the memory cell array, and a control logic and input/output interface block controlling the page buffer circuit to perform a data recover read operation at an access request, wherein at least one of the first to seventh program states is judged with a negative voltage being applied to a selected row, and wherein memory cells having at least three or more ones of the first to seventh program states among memory cells in an upper row adjacent to the selected row constitute a group of aggressor cells forcing word line coupling to memory cells of the selected row.

In this embodiment, the page buffer circuit includes a plurality of page buffers each corresponding to the columns of the memory cell array, and each of the page buffers includes an N-bit latch (N being an integer of 1 or more) which is set according to data read out from memory cells in a row adjacent to a read-requested row at the data recover read operation.

In this embodiment, N-bit latches of page buffers corresponding to first memory cells in the group of aggressor cells among the memory cells of the adjacent row are set to a first logic state according to data read from the first memory cells, and N-bit latches of page buffers corresponding to second memory cells among the memory cells of the adjacent row are set to a second logic state according to data read from the second memory cells.

In this embodiment, the data recover read operation is accomplished by performing a read operation on the selected row via page buffers corresponding to N-bit latches set to the first logic state and performing a read operation on the selected row via page buffers corresponding to N-bit latches set to the second logic state.

In this embodiment, columns of the page buffers corresponding to N-bit latches set to the first logic state are grounded when the read operation on the selected row is performed via page buffers corresponding to N-bit latches set to the first logic state, and columns of the page buffers corresponding to N-bit latches set to the second logic state are grounded when the read operation on the selected row is performed via page buffers corresponding to N-bit latches set to the second logic state.

In this embodiment, the at least three or more ones of the first to seventh program states include the first, third, fifth, and seventh program states.

Embodiments of the present general inventive concept may also be achieved by providing a read method of a non-volatile memory device which includes multi-bit memory cells arranged in rows and columns. The read method includes judging whether a data recover read scheme is selected, reading data from memory cells in a read-requested row according to the data recover read scheme when the data recover read scheme is selected, and reading data from the memory cells in the read-requested row according to a normal read scheme when the data recover read scheme is not selected, wherein selecting of the data recover read scheme is made by selection information provided from an external device.

In this embodiment, each of the memory cells stores 3-bit data and is programmed to have one of an erase state and a first to a seventh program states.

In this embodiment, at least one of the first to seventh program states is judged with a negative voltage being applied to the read-requested row, and memory cells having the first, third, fifth, and seventh program states among memory cells in a row adjacent to the read-requested row constitute a group of aggressor cells forcing word line coupling to memory cells of the read-requested row.

In this embodiment, the non-volatile memory device further includes a page buffer circuit configured to read data from the memory cell array, the page buffer circuit includes a plurality of page buffers each corresponding to the columns of the memory cell array, and each of the page buffers includes an N-bit latch (N being an integer of 1 or more) which is set according to data read out from memory cells in the row adjacent to the read-requested row at the data recover read operation.

In this embodiment, N-bit latches of page buffers corresponding to first memory cells in the group of aggressor cells among the memory cells of the adjacent row are set to a first logic state according to data read from the first memory cells, and N-bit latches of page buffers corresponding to second memory cells among the memory cells of the adjacent row are set to a second logic state according to data read from the second memory cells.

In this embodiment, selecting of the data recover read operation is performed by a controller to control the non-volatile memory device.

In this embodiment, the controller makes selecting of the data recover read scheme based on an error rate of data read from a specific area of the non-volatile memory device.

In this embodiment, the controller makes selecting of the data recover read scheme in an on-the-fly manner based on an error rate of data read from a specific area of the non-volatile memory device.

Embodiments of the present general inventive concept may also be achieved by providing a read method of a non-volatile memory device which includes multi-bit memory cells arranged in rows and columns. The read method includes judging whether one of a plurality of data recover read schemes is selected, when one of a plurality of data recover read schemes is selected, reading data from memory cells in a read-requested row according to the selected data recover read scheme, and when one of a plurality of data recover read schemes is not selected, reading from the memory cells in the read-requested row according to a normal read scheme, wherein selecting of the data recover read schemes is made by an external device.

In this embodiment, each of the memory cells stores 3-bit data and is programmed to have one of an erase state and a first to a seventh program states.

In this embodiment, memory cells having the first, third, fifth, and seventh program states among memory cells in a row adjacent to the read-requested row constitute a group of aggressor cells forcing word line coupling to memory cells of the read-requested row.

In this embodiment, memory cells having the first program state among the memory cells in the read-requested row constitute a first aggressor cell group forcing word line coupling to the memory cells in the read-requested row at a data recover read operation executed according to one of the data recover read schemes, and memory cells having the second to seventh program states among the memory cells in the read-requested row constitute a first aggressor cell group forcing word line coupling to the memory cells in the read-requested row at the data recover read operation.

Embodiments of the present general inventive concept may also be achieved by providing a memory card including a non-volatile memory device having memory cells arranged in rows and columns, and a controller having a buffer memory to store data read from the non-volatile memory device and configured to control the non-volatile memory device. The non-volatile memory device includes a normal read scheduler and a data recover read scheduler selected according to a control of the controller and performs a read operation corresponding to a request of the controller according to the selected read scheduler.

In this embodiment, each of the memory cells is programmed to have one of an erase state and a first to a seventh program state, at least one program state of the first to seventh program states is judged with a negative voltage being applied to a selected row, and memory cells having the first, third, fifth, and seventh program states among memory cells of an upper row adjacent to the selected row constitute a group of aggressor cells forcing word line coupling to memory cells of the selected row.

Embodiments of the present general inventive concept may also be achieved by providing a solid state drive which includes a storage media having a plurality of non-volatile memory devices, and a controller communicating with the storage media via a plurality of channels, wherein each of the plurality of non-volatile memory devices includes a memory cell array having memory cells arranged in rows and columns and programmed to have one of an erase state and a first to a seventh program state, a page buffer circuit configured to read data from the memory cell array, and a control logic and input/output interface block controlling the page buffer circuit to perform a data recover read operation at an access request, wherein at least one program state of the first to seventh program states is judged with a negative voltage being applied to a selected row, and wherein memory cells having the first, third, fifth, and seventh program states among memory cells of an upper row adjacent to the selected row constitute a group of aggressor cells forcing word line coupling to memory cells of the selected row at the data recover read operation.

In this embodiment, the page buffer circuit includes a plurality of page buffers each corresponding to the columns of the memory cell array, and each of the page buffers includes an N-bit latch (N being an integer of 1 or more) which is set according to data read out from memory cells in a row adjacent to a read-requested row at the data recover read operation.

In this embodiment, N-bit latches of page buffers corresponding to first memory cells in the group of aggressor cells among the memory cells of the adjacent row are set to a first logic state according to data read from the first memory cells, and N-bit latches of page buffers corresponding to second memory cells among the memory cells of the adjacent row are set to a second logic state according to data read from the second memory cells.

In this embodiment, the data recover read operation is accomplished by performing a read operation on the selected row via page buffers of N-bit latches set to the first logic state and a read operation on the selected row via page buffers of N-bit latches set to the second logic state.

Embodiments of the present general inventive concept may also be achieved by providing a non-volatile memory device which includes a memory cell array having memory cells arranged in rows and columns, a page buffer circuit configured to read data from the memory cell array, and a control logic and input/output interface block including a normal read scheduler controlling a normal read operation and a plurality of data recover read schedulers controlling different data recover read operations and configured to control the page buffer circuit at a read request, wherein one of the normal read scheduler and the plurality of data recover read schedulers is selected according to selection information provided from an external device.

In this embodiment, the selection information is determined according to an error rate of data read from the memory cell array at power-up, and the plurality of data recover read schedulers includes a first and a second data recover read scheduler, the first data recover read scheduler being selected by the selection information when the error rate exists between a first reference value and a second reference value, and the second data recover read scheduler being selected by the selection information when the error rate exceeds the second reference value.

In this embodiment, each of the memory cells stores 3-bit data and is programmed to have one of an erase state and a first to a seventh program states.

In this embodiment, memory cells having the first program state as the lowest program state among the memory cells of a row adjacent to the selected row constitute a first aggressor cell group forcing word line coupling to the memory cells of the selected row at the data recover read operation, and memory cells having the second to seventh program states among the memory cells of the adjacent row constitute a second aggressor cell group forcing word line coupling to the memory cells of the selected row.

In this embodiment, the first data recover read scheduler is configured to control a data recover read operation on the first aggressor cell group, and the second data recover read scheduler is configured to control a data recover read operation on the first and second aggressor cell groups.

Embodiments of the present general inventive concept may also be achieved by providing a solid state drive which includes a storage media having a plurality of non-volatile memory devices, and a controller communicating with the storage media via a plurality of channels, wherein each of the plurality of non-volatile memory devices includes a memory cell array having memory cells arranged in rows and columns, a page buffer circuit configured to read data from the memory cell array, and a control logic and input/output interface block including a normal read scheduler controlling a normal read operation and a first and a second data recover read schedulers controlling different data recover read operations and configured to control the page buffer circuit at a read request, wherein the controller determines selection information based on an error rate of data read from the memory cell array, wherein one of the normal read scheduler and the first and second read schedulers is selected according to the selection information, and wherein the first data recover read scheduler is selected by the selection information when the error rate exists between a first reference value and a second reference value, and the second data recover read scheduler is selected by the selection information when the error rate exceeds the second reference value.

In this embodiment, each of the memory cells stores 3-bit data and programmed to have one of an erase state and a first to a seventh program states.

In this embodiment, memory cells having the first program state as the lowest program state among the memory cells of a row adjacent to a selected row constitute a first aggressor cell group forcing word line coupling to the memory cells of the selected row at the data recover read operation, and memory cells having the second to seventh program states among the memory cells of the adjacent row constitute a second aggressor cell group forcing word line coupling to the memory cells of the selected row.

In this embodiment, the first data recover read scheduler is configured to control a data recover read operation on the first aggressor cell group, and the second data recover read scheduler is configured to control a data recover read operation on the first and second aggressor cell groups.

In this embodiment, one of the normal read scheduler and the first and second data recover read schedulers is selected in an on-the-fly manner at power-up.

Embodiments of the present general inventive concept may also be achieved by providing an operating method of a memory controller which controls a non-volatile memory device. The operating method includes judging an error rate of data read from the non-volatile memory device, and changing a read scheme of the non-volatile memory device according to the judgment, wherein the read scheme includes a normal read scheme and one or more data recover read schemes, and wherein the read scheme is changed at power-up or in use of the non-volatile memory device.

Embodiments of the present general inventive concept may also be achieved by providing reading data from a region of a non-volatile memory device, the region having a plurality of word lines and bit lines to define memory cells, determining whether memory cells in an nth word line have coupled and uncoupled voltage distributions, the coupled distributions being caused by programming memory cells of an (n+1)th word line; and executing a plurality of read operations on the memory cells of the nth word line to reduce a read error of the nth word line, where n is an integer≥1.

Determining whether the voltage distributions of memory cells of the nth word line are coupled may include judging whether an error rate of the read data exceeds a reference value.

The coupling of memory cells of the nth word line may be based on a threshold voltage shift caused by the programming of memory cells of the (n+1)th word line.

The number of the plurality of read operations may be the same as the number of threshold voltage shifts caused by the programming the memory cells of the (n+1)th word line.

The method may further include reading the uncoupled memory cells using a first read voltage, and reading the coupled memory cells using a second read voltage different from the first read voltage.

The multi-bit data may be 3-bit data stored in a single memory cell.

BRIEF DESCRIPTION OF THE DRAWINGS

The above and other features and utilities will become apparent from the following description with reference to the following figures, wherein like reference numerals refer to like parts throughout the various figures unless otherwise specified, and wherein:

FIGS. 2A to 2D are diagrams illustrating a program method of reducing word line coupling of the present general inventive concept.

FIG. 5 is a block diagram illustrating a non-volatile memory device according to an exemplary embodiment of the present general inventive concept.

FIG. 6 is a diagram illustrating an operation of classifying coupled memory cells and uncoupled memory cells of the present general inventive concept.

DETAILED DESCRIPTION OF THE EMBODIMENTS

Figure 1:
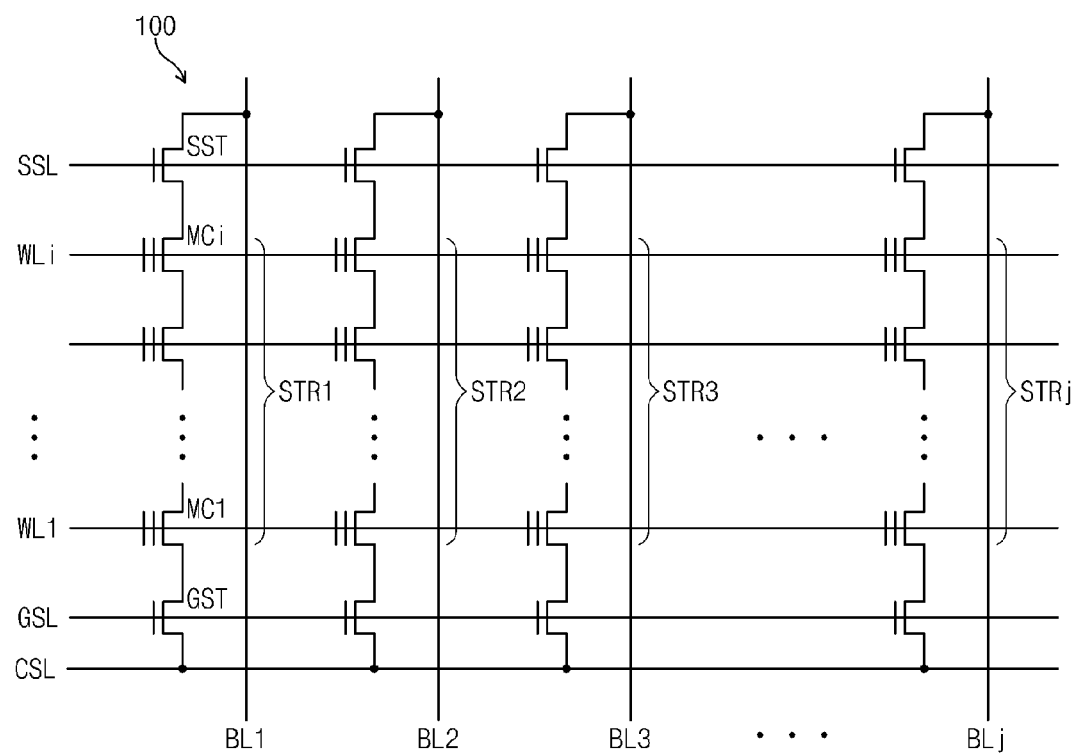
FIG. 1 is a diagram illustrating a part of a non-volatile memory device according to an exemplary embodiment of the present general inventive concept.

The present general inventive concept is described more fully hereinafter with reference to the accompanying drawings, in which embodiments of the present general inventive concept are shown. This present general inventive concept may, however, be embodied in many different forms and should not be construed as limited to the embodiments set forth herein. Rather, these embodiments are provided so that this disclosure will be thorough and complete, and will fully convey the scope of the present general inventive concept to those skilled in the art. In the drawings, the size and relative sizes of layers and regions may be exaggerated for clarity. Like numbers refer to like elements throughout.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present general inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this present general inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Demand for a high-density non-volatile memory may increase. Various techniques have been proposed to satisfy the demand. One of the proposed techniques is to increase the number of data bits stored in one memory cell. Increase in data bits of stored in a memory cell or increase in integration of memory cells may cause various interferences. One of such interferences may include the parasitic capacitance coupling caused between adjacent memory cells. In general, the parasitic capacitance coupling may include the bit line coupling of a column direction and word line coupling of a row direction. With word line coupling, when a program operation on an (n+1)th word line is executed after a program operation on an nth word line is executed, variation of threshold voltages of memory cells connected with the (n+1)th word line causes variation of threshold voltages of memory cells connected with the nth word line, so that threshold voltage distributions of memory cells connected with the nth word line are widened. Exemplary embodiments of the present general inventive concept provide a technique of improving the read error caused when threshold voltage distributions are widened, which will be more fully described.

In the specification, terms "nth word line", "selected word line", "read-requested word line", etc. may be used to designate a word line associated with memory cells in which read-requested data is stored. Terms "(n+1)th word line", "adjacent word line", "upper word line of a read-requested word line", "upper word line", etc. may be used to designate a word line associated with memory cells forcing word line coupling to memory cells in which read-requested data is stored.

FIG. 1 is a diagram illustrating a part of a non-volatile memory device according to an exemplary embodiment of the present general inventive concept.

An embodiment in FIG. 1 illustrates a NAND-structured non-volatile memory. Disclosed embodiments are not limited to this example. As illustrated in FIG. 1, a memory array 100 may include word lines WL1 to WLi and bit lines BL1 to BLj. The memory array 100 includes strings (or, NAND strings) STR1 to STRj, each of which has memory cells (or, non-volatile memory cells) MC1 to MCj. Memory cells are arranged adjacent intersections of the word lines WL1 to WLj and the bit lines BL1 to BLj. Memory cells in each NAND string are connected in series between a string selection transistor SST and a ground selection transistor GST. The string selection transistor SST is disposed at an intersection of a bit line (for example, BL1) and a string selection line SSL, and the ground selection transistor GST is disposed at an intersection of a bit line (for example, BL1) and a ground selection line GSL.

As illustrated in FIG. 1, in each NAND string, a source of the ground selection transistor GST is connected with a common source line CSL, and a drain thereof is connected with a source of a memory cell MC1 of a corresponding NAND string (for example, STR1). A drain of the string selection transistor SST is connected with a corresponding bit line BL1, and a source thereof is connected with a memory cell MCi of a corresponding NAND string STR1.

In some embodiments, the memory array 100 may be formed to have a single-layer array structure (or, called a two-dimensional array structure) or a multi-layer array structure (or, called a vertical or stack type three-dimensional array structure).

In some embodiments, memory cells may be formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc. A memory device having a charge trap flash structure as a charge storage layer is disclosed in U.S. Pat. No. 6,858,906 and U.S. Publication Patent Nos. 2004/0169238 and 2006/0180851, the entirety of which is incorporated by reference herein. A source-drain free flash structure is U.S. Pat. No. 7,623,366, the entirety of which is incorporated by reference herein. Memory cells can be formed of a variable resistance memory cell. An exemplary variable resistance memory cell and a memory device including the same are disclosed in U.S. Pat. No. 7,529,124, the entirety of which is incorporated by reference herein.

Although not illustrated in FIG. 1, as will be described hereinafter and well known, the memory array 100 may be connected to various circuits to read data from memory cells and to write data in memory cells.

FIGS. 2A to 2D are diagrams illustrating a program method of reducing word line coupling.

Regarding word line coupling, as demand continues for higher data storage capacity, memory arrays are designed to be more dense. As the density of memory arrays increases, electrical characteristics of the memory array may be affected. Therefore coupling noise, or word line coupling, between adjacent wordlines may increase as device density increases. This increased coupling between adjacent wordlines may negatively impact device performance and increase current leakage as well as the occurrence of soft errors which may alter the data storage in the memory cells.

Coupling from adjacent memory cells can shift the apparent charge level being read a sufficient amount to lead to an erroneous reading of the data stored. The effect of floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range. Thus, embodiments of the present general inventive concept provide a non-volatile memory device and methods of using the same to reduce word line coupling, including off-setting the impact of wordline coupling when writing to and reading from memory cells in a memory cell array.

Figure 2A:
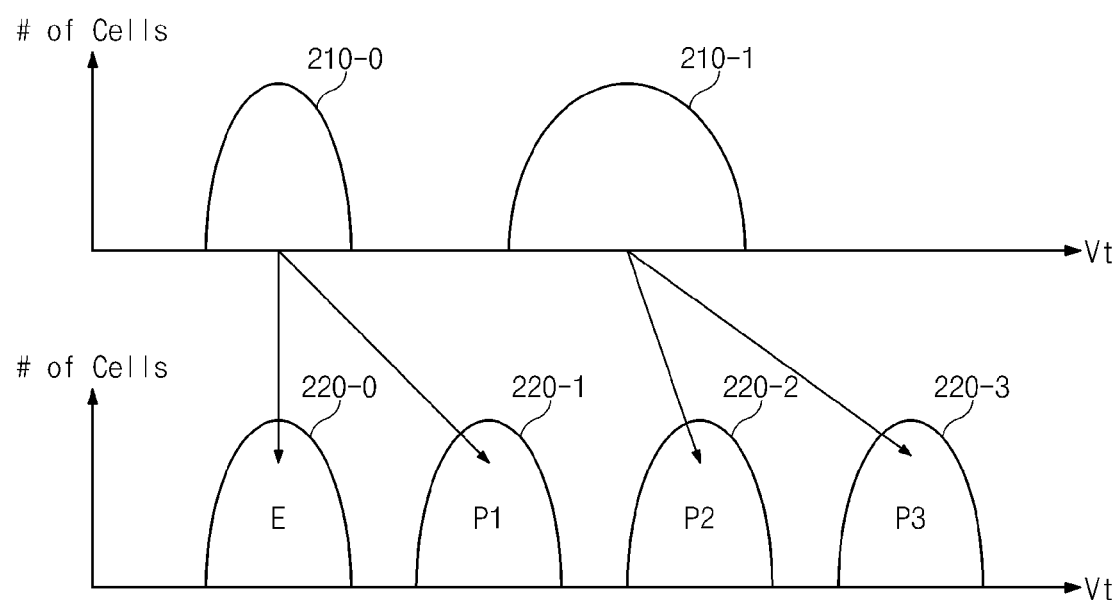

FIG. 2A illustrates a program method of reducing word line coupling. The program method will be performed under the assumption that each memory cell stores 2-bit data. In FIG. 2A, curves 210-0 and 210-1 illustrate threshold voltage distributions for memory cells after lower page programming, and curves 220-0, 220-1, 220-2, and 220-3 illustrate threshold voltage distributions for memory cells after upper page programming.

Each block of memory cells may include a set of bit lines forming columns and a set of word lines forming rows. Each block is typically divided into a number of pages. A page is typically a minimum unit of programming or reading, although more than one page may be programmed or read in a single operation. One or more pages of data are typically stored in one row of memory cells. A page can store one or more sectors of data, the size of which is generally defined by a host system.

Recent advance in EPROM or flash memory devices allows multiple bits to be stored in a single cell by utilizing multiple voltage threshold levels. Such multiple bits/multiple voltage threshold levels can be created by loading charges into the floating gates by writing consecutive pages to the gates, for example by writing a lower page and an upper page or a first page and a second page to the cells. The upper and lower pages can induce charges that defined multiple threshold voltages (Vt) of the memory cell, where the multiple threshold voltages can be utilized to read the multiple bits as determined when different read voltages are placed on the gate of the selected cells. Thus, the applied read voltage in addition to the stored charge can provide a read out for the different stored charges or multiple data in the cell.

After lower and upper pages are programmed, as illustrated in FIG. 2A, memory cells may have any one of four data states E (erase), P1, P2, and P3. Lower page 210-0 may represent logic "0" and lower page 210-1 may represent logic "1." E (erase) may be represented by binary, or logic "00." P1 may be represented by "01", P2 may be represented by "10" and P3 may be represented by "11." However, the present general inventive concept is not limited thereto. Different binary representations of the upper page programming may be chosen to represent the four data states. In case of a method illustrated in FIG. 2A, memory cells in the threshold voltage distribution 210-0 are programmed to a threshold voltage distribution 220-0 or a threshold voltage distribution 220-1 after the low page programming. Memory cells in the threshold voltage distribution 210-1 are programmed to a threshold voltage distribution 220-2 or a threshold voltage distribution 220-3 after the lower page programming.

Figure 2B:
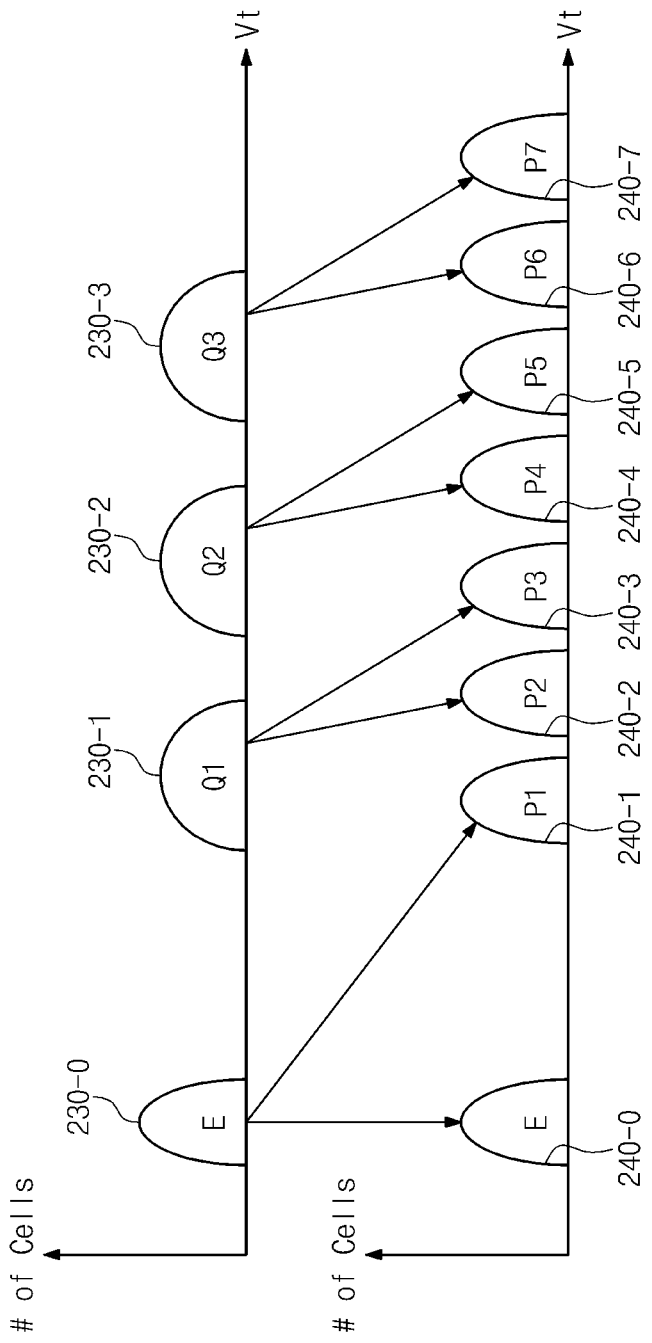

FIG. 2B illustrates a program method of reducing word line coupling which will be performed under the assumption that each memory cell stores 3-bit data. In FIG. 2B, curves 230-0 to 230-3 illustrate threshold voltage distributions for memory cells after a lower 2-page program procedure representing logic states, for example, of "00", "01", "10" and "11", and curves 240-0 to 240-7 illustrate threshold voltage distributions for memory cells after an upper 1-page program procedure.

After lower and upper pages are programmed, as illustrated in FIG. 2B, memory cells may have any one of eight data states E (erase) and P1 to P7, represented by binary logic states "000", "001", "010", "011", "100", "101", "110" and "111." In case of a method illustrated in FIG. 2B, memory cells in the threshold voltage distribution 230-0 are programmed to a threshold voltage distribution 240-0 or a threshold voltage distribution 240-1 after the low 2-page programming, and memory cells in the threshold voltage distribution 230-1 are programmed to a threshold voltage distribution 240-2 or a threshold voltage distribution 240-3 after the low 2-page programming. Memory cells in the threshold voltage distribution 230-2 are programmed to a threshold voltage distribution 240-4 or a threshold voltage distribution 240-5 after the low 2-page programming, and memory cells in the threshold voltage distribution 230-3 are programmed to a threshold voltage distribution 240-6 or a threshold voltage distribution 240-7 after the low 2-page programming.

FIG. 2C illustrates a program method of reducing word line coupling which will be performed under the assumption that each memory cell stores 3-bit data. In FIG. 2C, curves 250-0 to 250-3 illustrate threshold voltage distributions for memory cells after a lower 2-page program procedure, and curves 260-0 to 260-7 illustrate threshold voltage distributions for memory cells after an upper 1-page program procedure.

After lower and upper pages are programmed, as illustrated in FIG. 2C, memory cells may have any one of eight data states E and P1 to P7. In case of a method illustrated in FIG. 2C, memory cells in the threshold voltage distribution 250-0 are programmed to a threshold voltage distribution 260-0 or a threshold voltage distribution 260-1 after the low 2-page programming, and memory cells in the threshold voltage distribution 250-1 are programmed to a threshold voltage distribution 260-2 or a threshold voltage distribution 260-3 after the low 2-page programming. Memory cells in the threshold voltage distribution 250-2 are programmed to a threshold voltage distribution 260-4 or a threshold voltage distribution 260-5 after the low 2-page programming, and memory cells in the threshold voltage distribution 250-3 are programmed to a threshold voltage distribution 260-6 or a threshold voltage distribution 260-7 after the low 2-page programming.

The program method described in FIG. 2C is different from that in FIG. 2B in that negative verification voltages are used. That is, in case of the program method described in FIG. 2B, verification voltages each corresponding to program states P1 to P7 may be set to positive voltages (e.g., 0.1V, 1.0V, 1.9V, 2.8V, 3.7V, 4.6V, 5.5V), respectively. In other words, each of the program states P1 to P7 may be judged with a positive voltage being applied to a selected word line. On the other hand, in case of the program method described in FIG. 2C, verification voltages each corresponding to program states P1 and P2 may be set to negative voltages (e.g., −1.5V, −0.6V), and verification voltages each corresponding to program states P3 to P7 may be set to positive voltages (e.g., 0.3V, 1.2V, 2.1V, 3.0V, 3.9V). In other words, one or more ones of the program states P1 to P7 may be judged with a negative voltage being applied to a selected word line. It is well understood that the number of program states (or, data states) judged by a negative voltage is not limited to this disclosure.

Figure 2D:
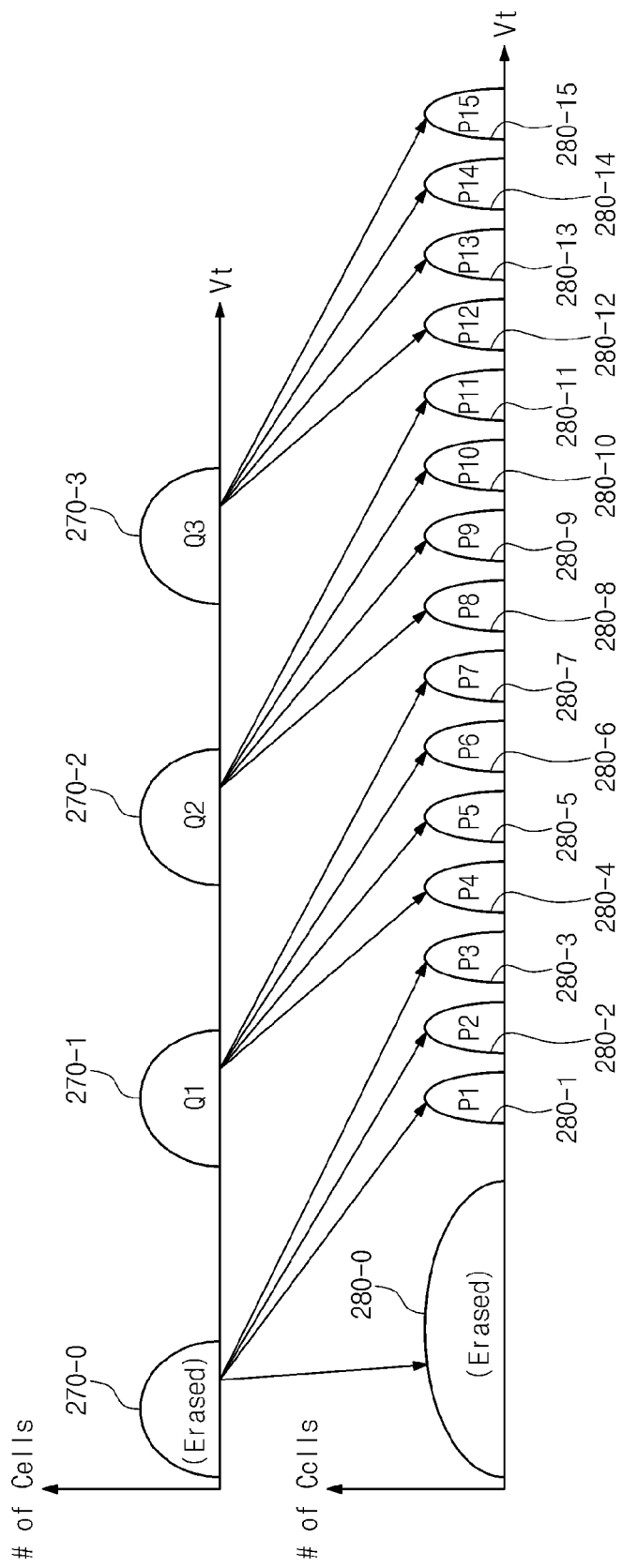

FIG. 2D illustrates a program method of reducing word line coupling which will be performed under the assumption that each memory cell stores 4-bit data. In FIG. 2D, curves 270-0 to 270-3 illustrate threshold voltage distributions for memory cells after a lower 2-page program procedure representing logic states, for example, of "00", "01", "10" and "11", and curves 280-0 to 280-15 illustrate threshold voltage distributions for memory cells after an upper 2-page program procedure representing logic states, for example, of "0000", "0001", "0010", "0011", "0100", "0101", "0110", "0111", "1000", "1001", "1010", "1011", "1100", "1101", "1110", and "1111." Arrangements of the logic states to programming threshold voltages are not limited thereto, and may be selected to have different combinations.

After lower and upper pages are programmed, as illustrated in FIG. 2D, memory cells may have any one of sixteen data states E and P1 to P15. In case of a method illustrated in FIG. 2D, memory cells in the threshold voltage distribution 270-0 are programmed to one of threshold voltage distributions 280-0 to 280-3 after the low 2-page programming, and memory cells in the threshold voltage distribution 270-1 are programmed to one of threshold voltage distributions 280-4 to 280-7 after the low 2-page programming. Memory cells in the threshold voltage distribution 270-2 are programmed to one of threshold voltage distributions 280-8 to 280-11 after the low 2-page programming, and memory cells in the threshold voltage distribution 270-3 are programmed to one of threshold voltage distributions 280-12 to 280-15 after the low 2-page programming.

If M-bit data (M being an integer of 2 or more) is stored in each memory cell, threshold voltages of memory cells of an nth word line may be shifted due to word line coupling when an upper page is programmed at memory cells of a (n+1)th word line. That is, threshold voltage distributions of memory cells of the nth word line may widen due to word line coupling as compared to before the upper page is programmed at memory cells of the (n+1)th (or, upper) word line. A threshold voltage distribution widens because memory cells of the nth word line selectively experience word line coupling when the upper page is programmed at memory cells of the (n+1)th word line.

In some embodiments, among memory cells of the (n+1)th word line, memory cells (or, called aggressor cells) forcing the coupling to memory cells of the nth word line may constitute one or more aggressor cell groups according to a program manner and/or a size (degree) of the coupling forced to the memory cells of the nth word line. Likewise, among memory cells of the (n+1)th word line, memory cells not forcing the coupling to memory cells of the nth word line may constitute one group. The remaining memory cells among the memory cells of the (n+1)th word line other than the aggressor cells may be defined as non-aggressor cells, not causing word line coupling with the nth word lines. The aggressor and non-aggressor cells may have any one of program states described in FIGS. 2A to 2D, respectively. By this definition, memory cells of the nth word line may be formed of coupled memory cells and uncoupled memory cells. For this reason, a threshold voltage distribution widens, which will be more fully described below. A program operation on the (n+1)th word line forcing the word line coupling to memory cells of the nth word line may be determined variably according to an address scramble manner.

Figure 3:
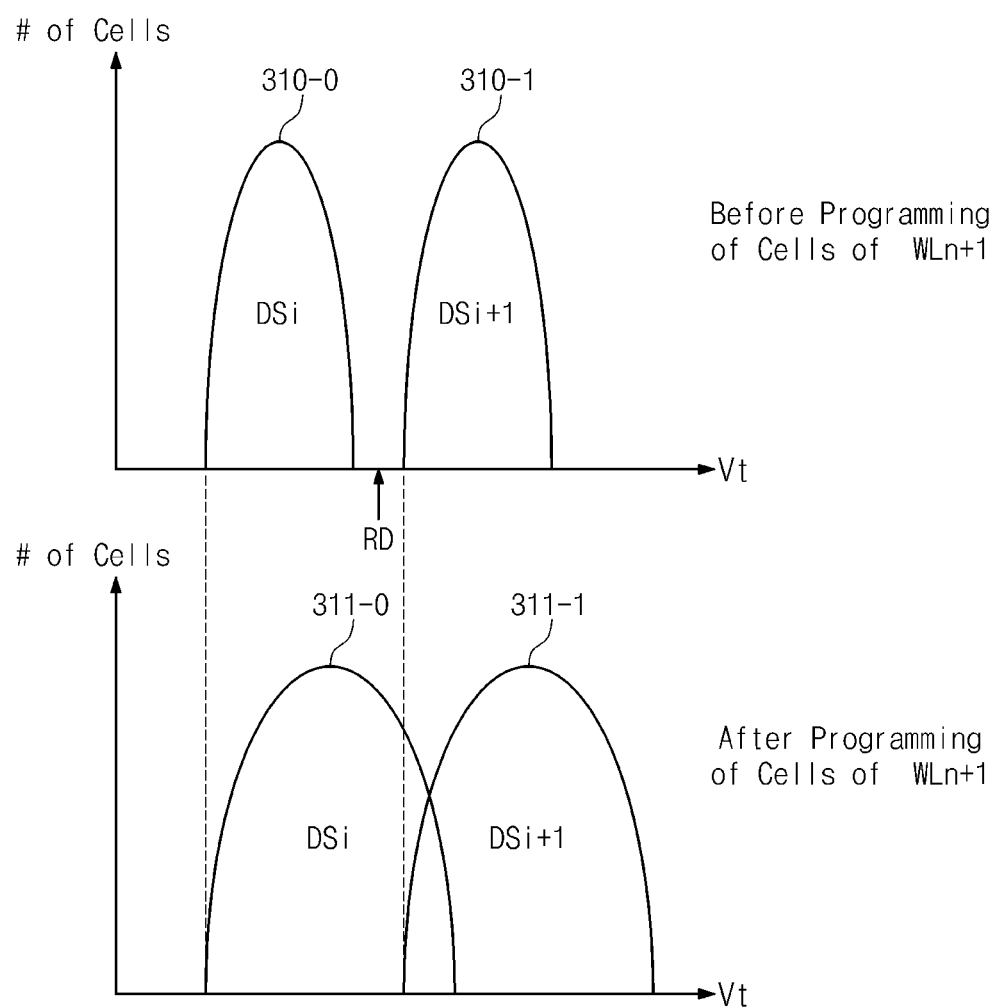
FIG. 3 is a diagram illustrating threshold voltage distributions associated with memory cells of an nth word line before and after word line coupling caused when memory cells of a (n+1)th word line are programmed of the present general inventive concept.

FIG. 3 is a diagram illustrating threshold voltage distributions associated with memory cells of an nth word line before and after word line coupling caused when memory cells of a (n+1)th word line are programmed.

An example in FIG. 3 illustrates two adjacent threshold voltage distributions 310-0 and 310-1 associated with memory cells of an nth word line before programming of memory cells of a (n+1)th word line, that is, before word line coupling. In FIG. 3, there are illustrated two threshold voltage distributions. But, it is well understood that more threshold voltage distributions may be provided according to a bit number per cell. The number of threshold voltage distributions may be determined according to the number of data bits of stored in a memory cell. For example, when m-bit data (m being 2 or more integer) is stored in a memory cell, $2^m$ threshold voltage distributions may be provided. Threshold voltage distributions 310-0 and 310-1 may be judged using a read voltage RD between threshold voltage distributions 310-0 and 310-1. Although not illustrated in the figures, remaining threshold voltage distributions may be judged using a read voltage between adjacent threshold voltage distributions. This read operation is named a normal read operation, and a read voltage RD used at the normal read operation is named a normal read voltage.

Threshold voltage distributions 311-0 and 311-1 illustrated in FIG. 3 illustrate threshold voltage distributions associated with memory cells of the nth word line after experiencing word line coupling which is caused when memory cells of the (n+1)th word line are programmed. The threshold voltage distributions 311-0 and 311-1 may include threshold voltage distributions associated with memory cells experiencing word line coupling and memory cells not experiencing word line coupling when memory cells of the (n+1)th word line are programmed.

Figure 4A:
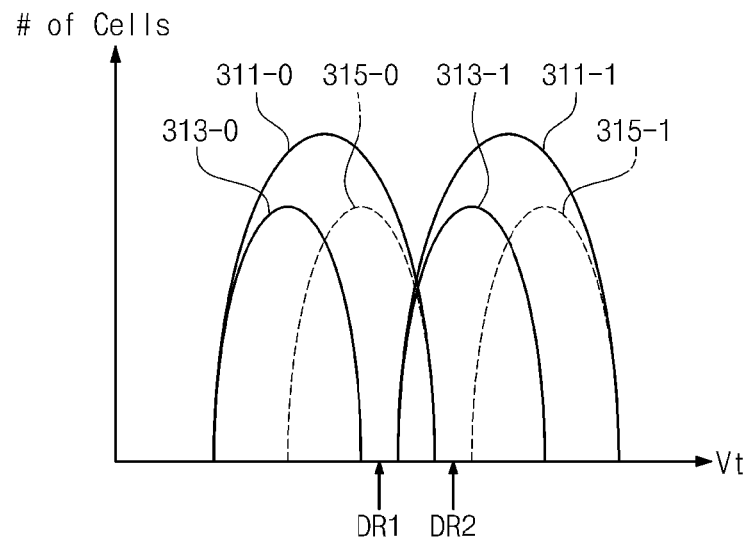
FIGS. 4A and 4B are diagrams illustrating all threshold voltage distributions in FIG. 3 including coupled and uncoupled memory cells.
Figure 4B:
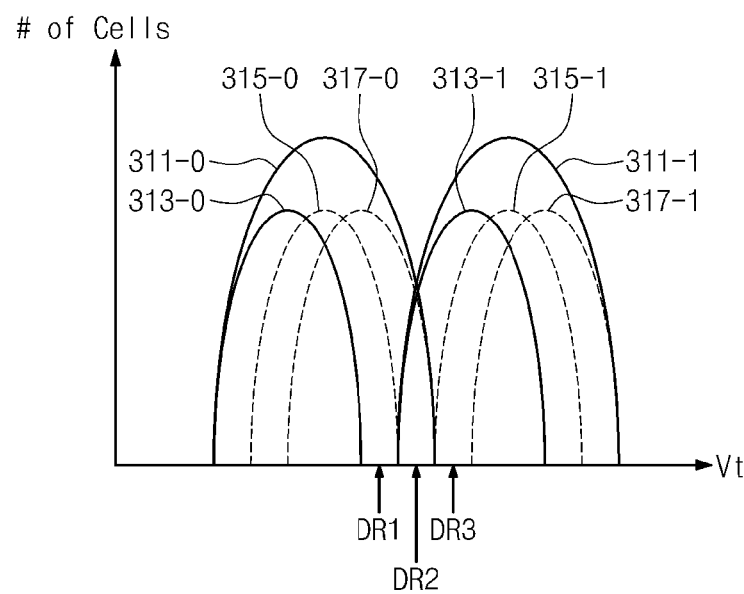

FIGS. 4A and 4B are diagrams illustrating all threshold voltage distributions in FIG. 3 including coupled and uncoupled memory cells.

In an example of FIG. 4A, threshold voltage distributions 313-0 and 313-1 illustrate threshold voltage distributions of memory cells (or, uncoupled memory cells) which do not experience a threshold voltage shift due to word line coupling. Threshold voltage distributions 315-0 and 315-1 illustrate threshold voltage distributions of memory cells (or, coupled memory cells) which experience a threshold voltage shift due to word line coupling. That is, the threshold voltage distributions 315-0 and 315-1 indicate a threshold voltage shift of memory cells which was programmed to data states 313-0 and 313-1.

Programmed memory cells of an nth word line may belong to uncoupled threshold voltage distributions 313-0 and 313-1 or to coupled threshold voltage distributions 315-0 and 315-1, based on a threshold voltage shift caused by programming of memory cells of the (n+1)th word line. As illustrated in FIG. 4A, a read voltage DR1 may be used to read uncoupled memory cells, that is, to discriminate memory cells within threshold voltage distributions 313-0 and 313-1. A read voltage DR2 may be used to read coupled memory cells, that is, to discriminate memory cells within threshold voltage distributions 315-0 and 315-1.

Two read operations may be executed with respect to one threshold voltage distribution (or, a data state) (formed of a coupled distribution and an uncoupled distribution) using the read voltages DR1 and DR2 in order to reduce the read error due to word line coupling. The number of read operations executed with respect to one data state may be determined according to the number of groups formed of aggressor cells (or, program states causing the coupling). For example, aggressor cells constitute one group or two or more groups. If aggressor cells constitute one group, a read operation may be carried out twice, once for the uncoupled nth word lines, and once for the coupled nth word lines. If aggressor cells constitute two groups, a read operation may be carried out three times, once for the uncoupled nth word lines, and twice for the two groups of coupled nth word lines.

Referring to FIG. 4A which illustrates a read operation executed when aggressor cells constitute one group, a read operation using the read voltage DR1 is made to discriminate memory cells within the uncoupled distributions 313-0 and 313-1, and a read operation using the read voltage DR2 is made to discriminate memory cells within the coupled distributions 315-0 and 315-1.

Memory cells to be read using the read voltage DR1 and memory cells to be read using the read voltage DR2 may be divided according to whether memory cells of an upper word line are programmed, which will be more fully described hereinafter. As a result, a read operation on memory cells of an upper word line of the selected word line, that is, of an adjacent word line, may be made previously before read operations on memory cells of a selected word line are made. The above-described read operations are called a data recover read operation, and the first and second read voltages DR1 and DR2 are referred to as the first and second data recover read voltages, respectively.

In an example of FIG. 4B, threshold voltage distributions 313-0 and 313-1 illustrate threshold voltage distributions of memory cells (or, uncoupled memory cells) which do not experience a threshold voltage shift due to word line coupling. Threshold voltage distributions 315-0, 315-1, 317-0 and 317-1 illustrate threshold voltage distributions of memory cells (or, coupled memory cells) which experience a threshold voltage shift due to word line coupling. That is, the threshold voltage distributions 315-0, 315-1, 317-0 and 317-1 indicate a threshold voltage shift of memory cells which was programmed to data states 313-0 and 313-1.

Programmed memory cells of an nth word line may belong to uncoupled threshold voltage distributions 313-0 and 313-1 or to coupled threshold voltage distributions 315-0, 315-1, 317-0 and 317-1, based on a threshold voltage shift caused by programming of memory cells of the (n+1)th word line.

As described above, if aggressor cells constitute two groups, as illustrated in FIG. 4B, a read operation may be carried out three times. Referring to FIG. 4B which illustrates a read operation executed when aggressor cells constitute two groups, a read operation using the read voltage DR1 is made to discriminate memory cells within the uncoupled distributions 313-0 and 313-1, a read operation using the read voltage DR2 is made to discriminate memory cells within the coupled distributions 315-0 and 315-1, and a read operation using the read voltage DR3 is made to discriminate memory cells within the coupled distributions 317-0 and 317-1.

Memory cells to be read using the read voltage DR1, memory cells to be read using the read voltage DR2, memory cells to be read using the read voltage DR3 may be divided according to whether memory cells of an upper word line are programmed, which will be more fully described hereinafter. The first to third read voltages DR1 to DR3 are referred to as the first to third data recover read voltages, respectively.

As described thus far, aggressor cells may constitute one group and two groups. That is, aggressor cells may represent groups of (n+1)th memory cells that force coupling to memory cells of the nth word line. But, it is well understood that the number of groups of aggressor cells is not limited thereto.

In an exemplary embodiment, in case of 3-bit data, if aggressor cells constitute one group, they may be memory cells programmed to have program states P1, P3, P5 and P7 as illustrated in FIGS. 2B and 2C. In another exemplary embodiment, in case of 3-bit data, if aggressor cells constitute one group, they may be memory cells programmed to have at least three program states of program states illustrated in FIGS. 2B and 2C. If aggressor cells constitute two groups, they may be memory cells programmed to have a program state P1 in FIG. 2B and remaining program states P2 to P7 therein. But, program states to define groups of aggressor cells are not limited thereto. For example, program states to define groups of aggressor cells can be determined variously according to a program manner and a coupling level. Alternatively, the number of aggressor cell groups (or, program states in each group) may be determined considering a program-erase cycle. For example, after a predetermined program-erase cycle elapses, program states of aggressor cells can be reconfigured based on an error rate. Program states (P1, P3, P5, P7) or (P2 to P7) within one aggressor cell group may be reconfigured to two or more groups.

FIG. 5 is a block diagram illustrating a non-volatile memory device according to an exemplary embodiment of the present general inventive concept.

Referring to FIG. 5, a non-volatile memory device 1000 according to an exemplary embodiment of the present general inventive concept may be a flash memory device. But, it is well understood that the present general inventive concept is not limited to the flash memory device. For example, the present general inventive concept may be applied to non-volatile memory devices such as a phase change random access memory (PRAM), a magnetoresistive random access memory (MRAM), a ferroelectric random access memory (FRAM), a resistance random access memory (RRAM), a spin transfer torque random access memory (STT-RAM), and the like.

The non-volatile memory device 1000 may include a memory cell array 1100 to store data information. The memory cell array 1100 is formed of a plurality of memory blocks, each of which may be configured to be identical to that in FIG. 1, for example. A row selector circuit 1200 operates responsive to the control of a control logic and input/output interface block 1300 and performs selecting and driving on the memory cell array 1100. A page buffer circuit 1400 operates responsive to the control of a control logic and input/output interface block 1300 and operates as a read circuit or as a write circuit according to a mode of operation. For example, at a read operation, the page buffer circuit 1400 operates as a circuit which reads data from the memory cell array 1100 in response to the control of the control logic and input/output interface block 1300. At a program/read operation, the page buffer circuit 1400 operates as a circuit which writes program data in the memory cell array 1100 in response to the control of the control logic and input/output interface block 1300. A column selector circuit 1500 provides a data path between the page buffer circuit 1400 and the control logic and input/output interface block 1300.

The control logic and input/output interface block 1300 is configured to control an overall operation of the non-volatile memory device 1000 according to a request of an external device (e.g., a controller). The control logic and input/output interface block 1300 includes a normal read scheduler 1310 and a data recover read scheduler 1320. The control logic and input/output interface block 1300 controls a read operation using any one of the normal read scheduler 1310 and the data recover read scheduler 1320. One of the normal read scheduler 1310 and the data recover read scheduler 1320 may be selected by the external device (e.g., a controller). For example, one of the normal read scheduler 1310 and the data recover read scheduler 1320 may be selected by the external device (or, selection information from the external device) at power-up. Alternatively, one of the normal read scheduler 1310 and the data recover read scheduler 1320 may be selected by the external device (or, selection information from the external device) while the non-volatile memory device 1000 is in use (that is, by an on-the-fly manner). If the normal read scheduler 1310 is selected, a read operation may be carried out with respect to an access-requested (or, read-requested) word line. In this case, a normal read voltage RD described with respect to FIG. 3 is used to discriminate each program state. If the data recover read scheduler 1320 is selected, a read operation may be carried out with respect to both an upper word line adjacent to an access-requested (or, read-requested) word line and the access-requested word line, respectively. Data recover read voltages DR1 and DR2 described in FIG. 4A or data recover read voltages DR1, DR2, and DR3 described in FIG. 4B are used to discriminate one program state.

In an exemplary embodiment, the power-up may include a period from a point of time when a power is supplied to the non-volatile memory device 1000 to a point of time when an access is requested from an external device.

FIG. 6 is a diagram illustrating an operation of classifying coupled memory cells and uncoupled memory cells.

Referring to FIG. 6, page buffers PB1 to PBj are connected with bit lines BL1 to BLj of a memory cell array 1100, respectively. The page buffers PB1 to PBj are configured to read data from memory cells of a read requested (or, access requested) word line (e.g., WLn). Each of the page buffers PB1 to PBj includes an N-bit latch 1401. Although not illustrated in FIG. 6, each of the page buffers PB1 to PBj may further include a data latch circuit to read data from a memory cell and to store data to be stored in a memory cell. Each of the page buffers PB1 to PBj can be connected with a pair of bit lines.

As illustrated in FIGS. 5 and 6, a normal read operation, the page buffers PB1 to PBj read data from memory cells of a read requested (or, access requested) word line (e.g., WLn) in response to the control of a control logic and input/output interface block 1300. The read data is provided to an external device via a column decoder circuit 1500 and the control logic and input/output interface block 1300. At the normal read operation, a read voltage RD described with respect to FIG. 3 may be used to discriminate each program state. At a data recover read operation, the page buffers PB1 to PBj read data from memory cells of a word line (e.g., WLn+1) adjacent to the read requested (or, access requested) word line (e.g., WLn) in response to the control of a control logic and input/output interface block 1300. A read voltage RD described with respect to FIG. 3 may be used to discriminate each program state of memory cells of the adjacent word line. The read data is logically processed according to the control of the control logic and input/output interface block 1300, and the processed values are stored in corresponding N-bit latches 1401.

In an exemplary embodiment, it is assumed that aggressor cells constitute one group. With this assumption, an aggressor cell group includes program states P1, P3, P5, and P7 in case of a 3-bit data program scheme illustrated in FIGS. 2B and 2C. The N-bit latch 1401 corresponding to an aggressor cell causing a word line coupling can be set to '0', and the N-bit latch 1401 corresponding to a non-aggressor cell causing a word line coupling can be set to '1'. It is assumed that aggressor cells constitute two groups. With this assumption, the first aggressor cell group includes a program state P1 in case of a 3-bit data program scheme illustrated in FIG. 2B, and the second aggressor cell group includes program states P2 to P7 in case of a 3-bit data program scheme illustrated in FIG. 2B. The N-bit latch 1401 corresponding to an aggressor cell causing a word line coupling may be set to '00', and the N-bit latch 1401 corresponding to a non-aggressor cell causing a word line coupling may be set to '01'. A value set in the N-bit latch 1401 is not limited thereto. For example, a value set in the N-bit latch 1401 can be changed variously according to a cell-per-bit number, the number of aggressor cell groups, and the like.

At a data recover read operation, after the N-bit latches 1401 are set according to data read from memory cells of an upper word line, the page buffers PB1 to PBj read data from memory cells of a read requested word line based on values stored in corresponding N-bit latches 1401. At this time, the number of read operations may be decided according to the number of aggressor cell groups. For example, in case of a data recover read scheme described with respect to FIG. 4A, a read operation may be carried out twice using data recover read voltages DR1 and DR2. A read operation using the data recover read voltage DR1 is performed via page buffers each having an N-bit latch 1401 set to '0'. At this time, bit lines of page buffers each having an N-bit latch 1401 set to '1' may be set to a ground voltage. A read operation using the data recover read voltage DR2 is performed via page buffers each having an N-bit latch 1401 set to '1'. At this time, bit lines of page buffers each having an N-bit latch 1401 set to '0' may be set to a ground voltage. Memory cells of the read requested word line may be divided into coupled memory cells and uncoupled memory cells according to values of the N-bit latches 1401 of the page buffers PB1 to PBj.

In case of a data recover read scheme described in FIG. 4B, a read operation may be carried out three times using data recover read voltages DR1, DR2 and DR3. A read operation using the data recover read voltage DR1 is performed via page buffers each having an N-bit latch 1401 set to '00'. At this time, bit lines of page buffers each having an N-bit latch 1401 set to '01' and '11' may be set to a ground voltage. A read operation using the data recover read voltage DR2 is performed via page buffers each having an N-bit latch 1401 set to '01'. At this time, bit lines of page buffers each having an N-bit latch 1401 set to '00' and '11' may be set to a ground voltage. A read operation using the data recover read voltage DR3 is performed via page buffers each having an N-bit latch 1401 set to '11'. At this time, bit lines of page buffers each having an N-bit latch 1401 set to '00' and '01' may be set to a ground voltage.

Figure 7:
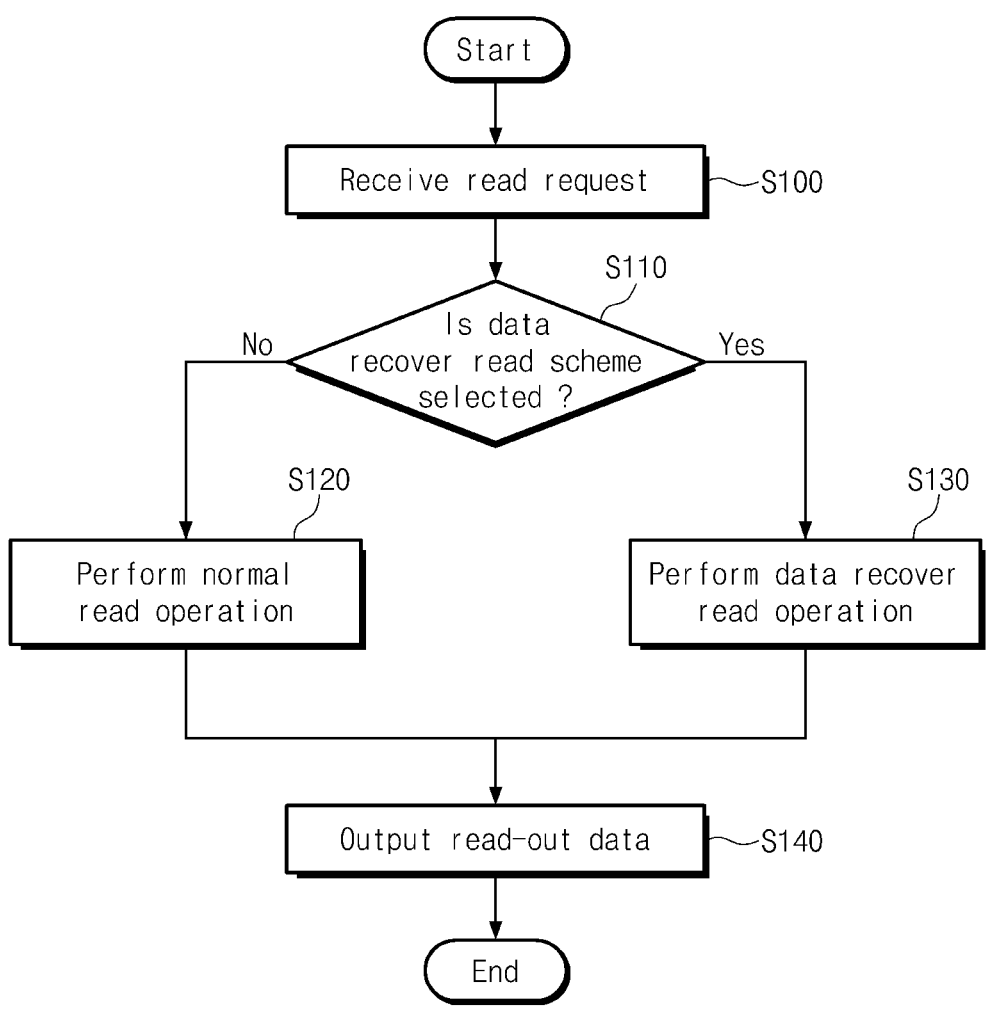
FIG. 7 is a flowchart illustrating a read method of a non-volatile memory device according to an exemplary embodiment of the present general inventive concept.

FIG. 7 is a flowchart illustrating a read method of a non-volatile memory device according to an exemplary embodiment of the present general inventive concept.

Referring to FIG. 7, in operation S100, a non-volatile memory device 1000 receives a read request from an external device (e.g., a controller). In operation S110, the non-volatile memory device 1000 judges whether a data recover read scheme is selected. If the data recover read scheme is judged to be selected, the read method proceeds to operation S120, in which a normal read operation is carried out under the control of a normal read scheduler 1310. That is, a read operation on memory cells of a read requested word line is carried out. The read operation on the memory cells of the read requested word line may be performed with a normal read voltage RD described with respect to FIG. 3 being applied to the read requested word line. Afterwards, the read method proceeds to operation S140. On the other hand, if the data recover read scheme is selected, the read method proceeds to operation S130, in which a data recover read operation is carried out under the control of a data recover read scheduler 1320. This will be more fully described with reference to FIGS. 8 and 9. Afterwards, the read method proceeds to operation S140, in which data read in operation S120 or S130 is output to the external device. Accordingly, the read method is ended.

In an exemplary embodiment, the operation S110 may be made according to selection information provided from the external device. Since the data recover read scheduler 1320 or the normal read scheduler 1310 is selected according to an input of the selection information, the operation S110 can be skipped.

Figure 8:
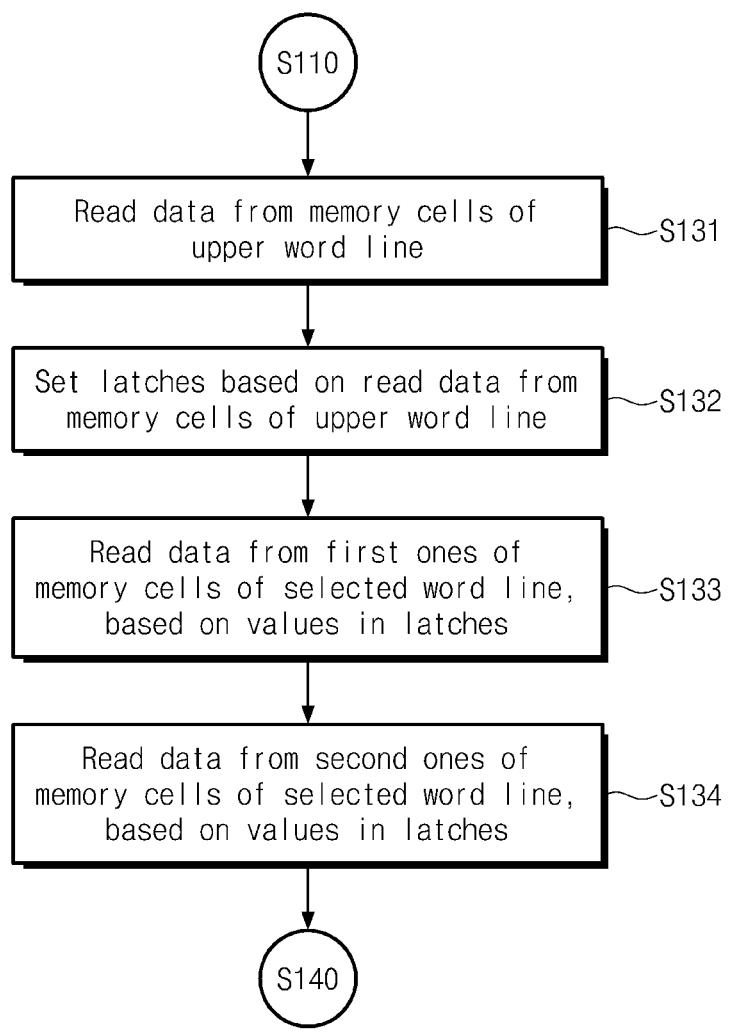
FIG. 8 is a flowchart illustrating a data recover read operation illustrated in FIG. 7 according to an exemplary embodiment of the present general inventive concept.

FIG. 8 is a flowchart illustrating a data recover read operation illustrated in FIG. 7 according to an exemplary embodiment of the present general inventive concept.

A data recover read operation in FIG. 8 will be described under the assumption that aggressor cells constitute one group. That is, aggressor cells may represent one group of (n+1)th memory cells that force coupling to memory cells of the nth word line. For example, one aggressor cell group may include a program state P1 in FIG. 2B or program states P1, P3, P5, and P7 in FIGS. 2B and 2C. But, program states in an aggressor cell group are not limited thereto.

In operation S131, data is read from memory cells of an upper word line adjacent to a read request word line. This may be made via a page buffer circuit 140 under the control of a control logic and input/output interface block 1300. Data may be read from the memory cells of the upper word line with a normal read voltage RD being applied to the upper word line. A normal read voltage RD is used to discriminate adjacent program states (e.g., E and P1), and normal read voltages are used to discriminate remaining states. The read data may be stored in data latch circuits of the page buffer circuit 1400. In operation S132, N-bit latches 1401 of page buffers PB1 to PBj in the page buffer circuit 1400 may be set to '0' or '1' according to data read from the memory cells of the upper word line.

In operation S133, data is read from the first memory cells of the memory cells of the read requested word line based on values stored in the N-bit latches 1401. At this time, a data recover read voltage DR1 is applied to the read requested word line, and bit lines corresponding to N-bit latches 1401 set to '1' are set to a ground voltage. According to this condition, data may be read from memory cells not experiencing coupling as the first memory cells.

In operation S134, data is read from the second memory cells of the memory cells of the read requested word line based on values stored in the N-bit latches 1401. At this time, a data recover read voltage DR2 is applied to the read requested word line, and bit lines corresponding to N-bit latches 1401 set to '0' are set to a ground voltage. According to this condition, data may be read from memory cells not experiencing the coupling as the second memory cells. Afterwards, the procedure goes to operation S140 in FIG. 7.

Figure 9:
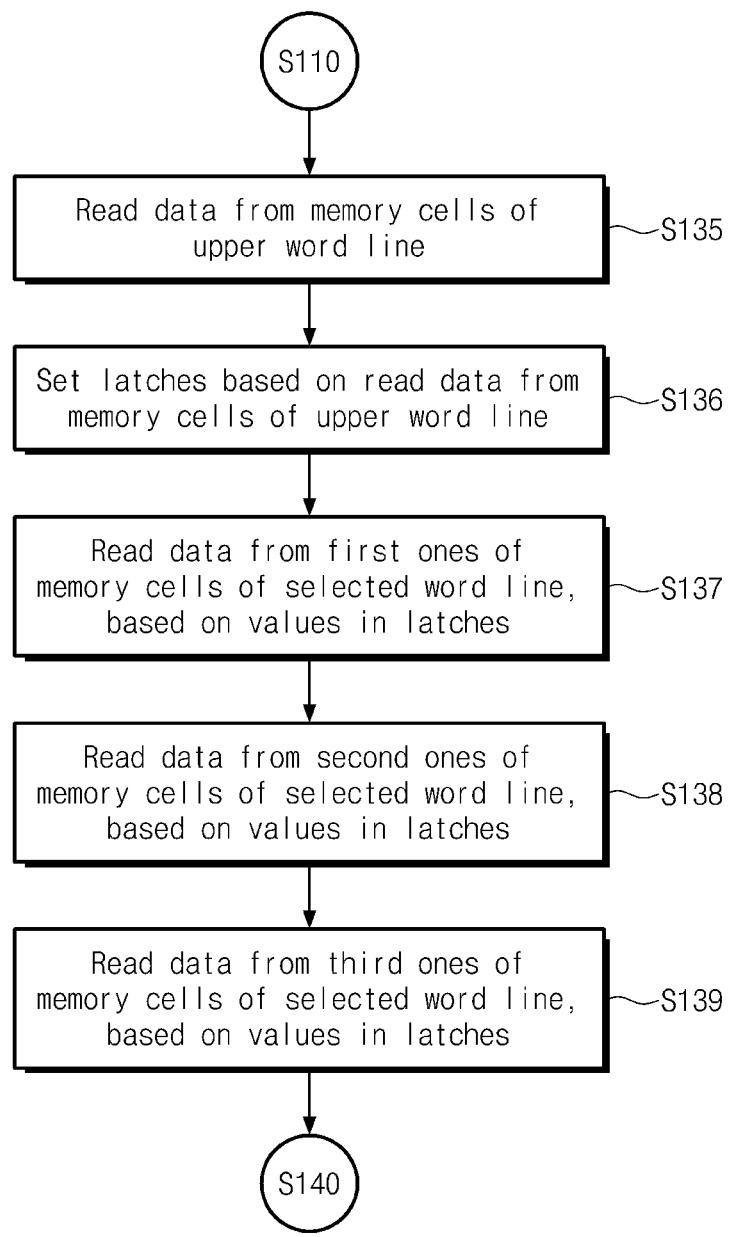
FIG. 9 is a flowchart illustrating a data recover read operation illustrated in FIG. 7 according to another exemplary embodiment of the present general inventive concept.

FIG. 9 is a flowchart illustrating a data recover read operation illustrated in FIG. 7 according to another exemplary embodiment of the present general inventive concept.

A data recover read operation in FIG. 9 will be described under the assumption that aggressor cells constitute two groups. For example, one of the two aggressor cell groups may include a program state P1 in FIG. 2B, and the other thereof may include program states P2 to P7 in FIG. 2B. But, program states in an aggressor cell group are not limited thereto.

In operation S135, data is read from memory cells of an upper word line adjacent to a read request word line. This may be made via a page buffer circuit 140 under the control of a control logic and input/output interface block 1300. Data may be read from the memory cells of the upper word line with a normal read voltage RD being applied to the upper word line. A normal read voltage RD is used to discriminate adjacent program states (e.g., E and P1), and normal read voltages are used to discriminate remaining states.

In operation S136, N-bit latches 1401 of page buffers PB1 to PBj in the page buffer circuit 1400 may be set to '00', '01', or '11' according to data read from the memory cells of the upper word line. In operation S137, data is read from the first memory cells of the memory cells of the read requested word line based on values stored in the N-bit latches 1401. At this time, a data recover read voltage DR1 is applied to the read requested word line, and bit lines corresponding to N-bit latches 1401 set to '01' and '11' are set to a ground voltage. According to this condition, data may be read from memory cells not experiencing coupling, as the first memory cells.

In operation S138, data is read from the second memory cells of the memory cells of the read requested word line based on values stored in the N-bit latches 1401. At this time, a data recover read voltage DR2 is applied to the read requested word line, and bit lines corresponding to N-bit latches 1401 set to '00' and '11' are set to a ground voltage. According to this condition, data may be read from memory cells experiencing the coupling and having program states P2 to P7, as the second memory cells.

In operation S139, data is read from the third memory cells of the memory cells of the read requested word line based on values stored in the N-bit latches 1401. At this time, a data recover read voltage DR3 is applied to the read requested word line, and bit lines corresponding to N-bit latches 1401 set to '00' and '01' are set to a ground voltage. According to this condition, data may be read from memory cells experiencing the coupling and having a program state P1, as the third memory cells.

Figure 10:
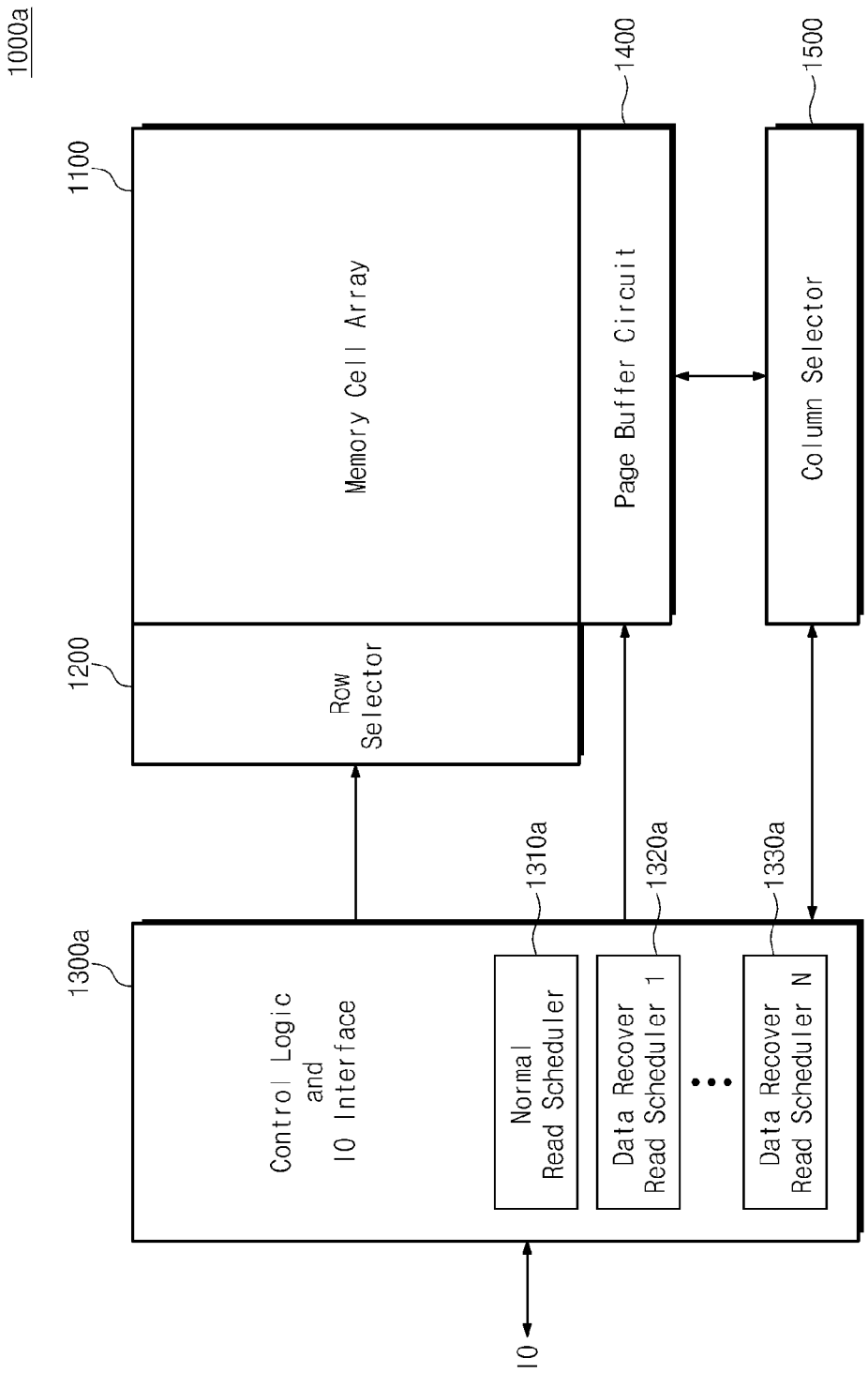
FIG. 10 is a block diagram illustrating a non-volatile memory device according to another exemplary embodiment of the present general inventive concept.

FIG. 10 is a block diagram illustrating a non-volatile memory device according to another exemplary embodiment of the present general inventive concept. Referring to FIG. 10, a non-volatile memory device 1000a includes a memory cell array 1100, a row selector circuit 1200, a control logic and input/output interface block 1300a, a page buffer circuit 1400, and a column selector circuit 1500. In FIG. 10, constituent elements which have the same function as those in FIG. 5 may be represented by the same reference numerals, and description thereof is thus omitted.

The control logic and input/output interface block 1300*a* includes a normal read scheduler 1310*a* and a plurality of data recover read schedulers 1320*a* to 1330*a*. One of the schedulers 1310*a* to 1330*a* may be selected by an external device (e.g., a controller) at power-up, for example. Alternatively, one of the schedulers 1310*a* to 1330*a* may be selected by the external device while the non-volatile memory device 2000*a* is in use (or, in an on-the-fly manner). The normal read scheduler 1310*a* controls the page buffer circuit 1400 such that data is read from memory cells of a read requested word line.

Each of the plurality of data recover read schedulers 1320*a* to 1330*a* controls the page buffer circuit 1400 to perform the above-described data recover read operation. The plurality of data recover read schedulers 1320*a* to 1330*a* includes the first data recover read scheduler configured to control a data recover read operation in the event that aggressor cells constitute one group and the second data recover read scheduler configured to control a data recover read operation in the event that aggressor cells constitute two groups. The first data recover read scheduler 1320*a* controls a read operation according to a read method described with respect to FIGS. 7 and 8, and description thereof is thus omitted. The second data recover read scheduler 1330*a* controls a read operation according to a read method described with respect to FIGS. 7 and 9, and description thereof is thus omitted.

Herein, the number of data recover read schedulers is not limited thereto. For example, the number of data recover read schedulers may be decided according to the number of aggressor cell groups.

Figure 11:
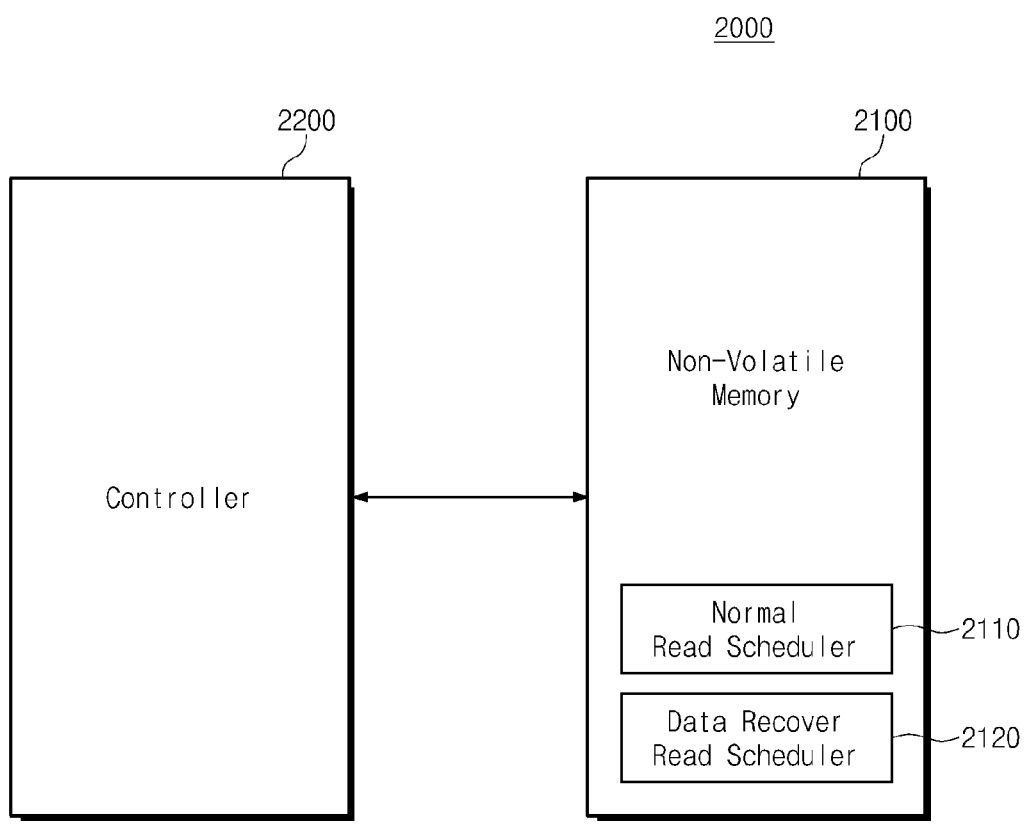
FIG. 11 is a block diagram illustrating a memory system including a non-volatile memory device according to an exemplary embodiment of the present general inventive concept.

FIG. 11 is a block diagram illustrating a memory system including a non-volatile memory device according to an exemplary embodiment of the present general inventive concept.

Referring to FIG. 11, a memory system 2000 includes at least one non-volatile memory device 2100 and a controller 2200. The non-volatile memory device 2100 may be configured substantially the same as that in FIG. 5. For example, the non-volatile memory device 2100 may include a normal read scheduler 2110 and a data recover read scheduler 2120. The normal read scheduler 2110 is configured to control a normal read operation. The data recover read scheduler 2120 is configured to control a data recover read operation executed when aggressor cells constitute one group or a data recover read operation executed when aggressor cells constitute two groups.

The controller 2200 is configured to control the non-volatile memory device 2100. The controller 2200 is configured to select one of the schedulers of the non-volatile memory device 2100 at power-up. For example, at power-up, the controller 2200 may read data from a predetermined region of the non-volatile memory device 2100, and may select one of the schedulers of the non-volatile memory device 2100 based on an error rate of the read data. If the error rate is below a reference value, the normal read scheduler 2110 is selected by the controller 2200. If the error rate exceeds the reference value, the data recover read scheduler 2120 is selected by the controller 2200.

In an exemplary embodiment, the predetermined region may be decided according to a fixed address or a variable address. If the predetermined region is determined according to the variable address, the controller 2200 may decide the predetermined region based on a mapping table indicating a region of the non-volatile memory device 2100 where data is stored. But, a manner of deciding the predetermined region is not limited thereto. Alternatively, it is possible to judge locations of error bits using a test pattern stored in the non-volatile device 2100 (or, in the controller 2200) and to decide aggressor cells based on data states of memory cells at the judged locations.

Figure 12:
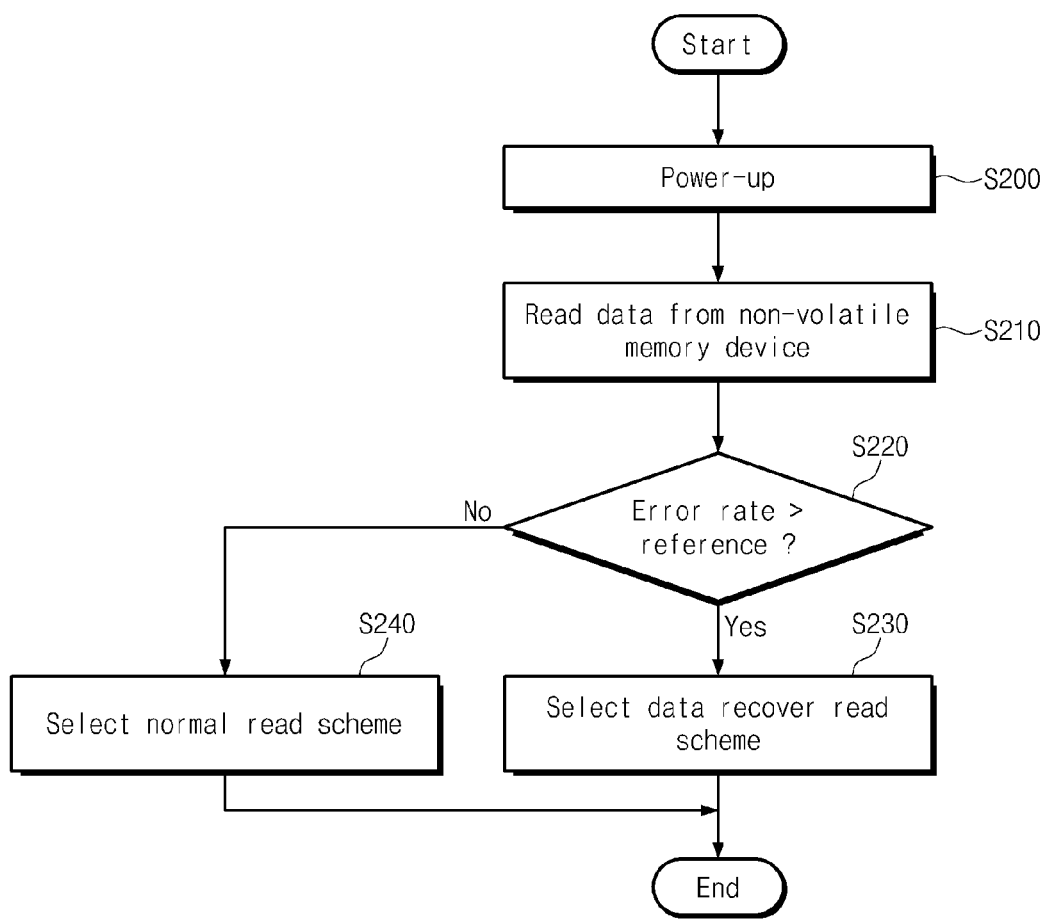
FIG. 12 is a flowchart illustrating a scheduler setting method of a controller in FIG. 11 according to an exemplary embodiment of the present general inventive concept.

FIG. 12 is a flowchart illustrating a scheduler setting method of a controller in FIG. 11 according to an exemplary embodiment of the present general inventive concept. Below, a scheduler setting method according to an exemplary embodiment of the inventive concept will be more fully described with reference to accompanying drawings.

In operation S200, a memory system 2000 is powered. In operation S210, a controller 2200 reads data from a predetermined region of a non-volatile memory device 2100. The controller 2200 judges whether an error rate of the read data exceeds a reference value. If the error rate of the read data exceeds the reference value, the method proceeds to operation S230, in which a data recover read scheduler 2120 of the non-volatile memory device 2100 is selected under the control of the controller 2200. If the error rate of the read data does not exceed the reference value, the method proceeds to operation S240, in which a normal read scheduler 2110 of the non-volatile memory device 2100 is selected under the control of the controller 2200. Afterwards, the method is completed.

Following the above-described power-up sequence, the controller 2200 may judge whether an access to the non-volatile memory device 2100 is requested. If so, the requested access may be processed under the control of the controller 2200.

Figure 13:
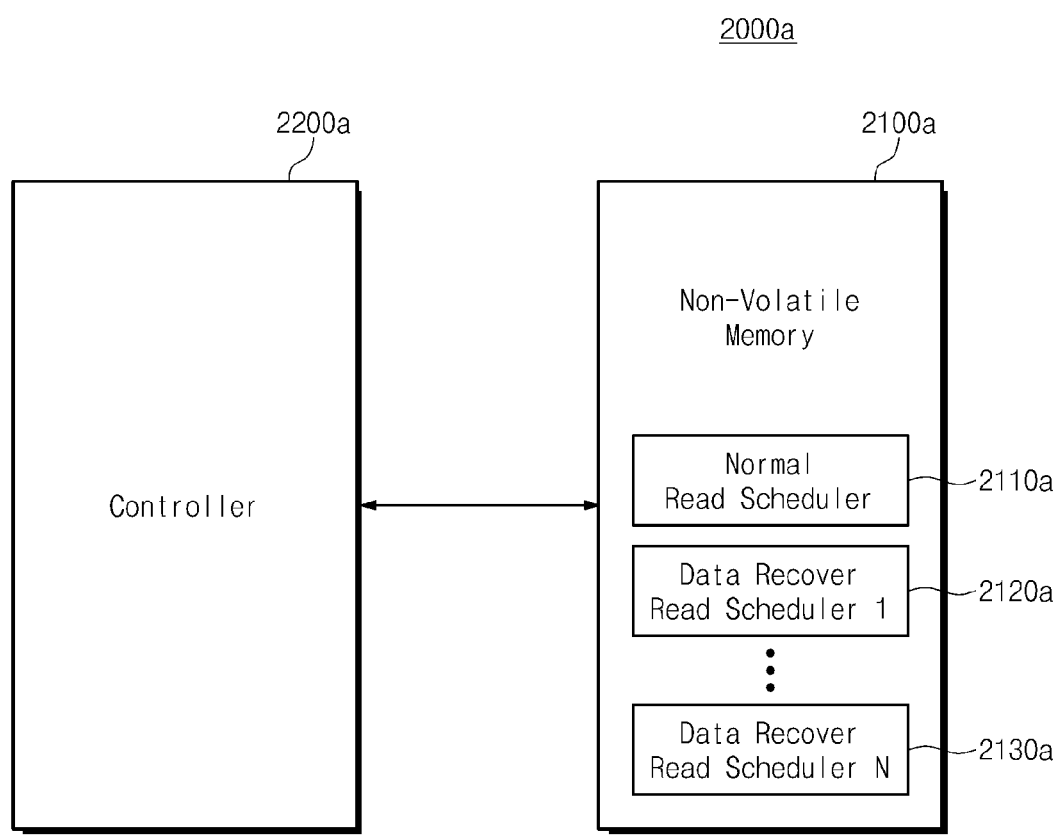
FIG. 13 is a block diagram illustrating a memory system including a non-volatile memory device according to another exemplary embodiment of the present general inventive concept.

FIG. 13 is a block diagram illustrating a memory system including a non-volatile memory device according to another exemplary embodiment of the present general inventive concept.

Referring to FIG. 13, a memory system 2000*a* includes at least one non-volatile memory device 2100*a* and a controller 2200*a*. The non-volatile memory device 2100*a* may be configured substantially the same as that in FIG. 10. For example, the non-volatile memory device 2100*a* includes a normal read scheduler 2110*a* and a plurality of data recover read schedulers 2120*a* to 2130*a*. The normal read scheduler 2110*a* is configured to control a normal read operation.

The plurality of data recover read schedulers 2120*a* to 2130*a* includes the first data recover read scheduler configured to control a data recover read operation in the event that aggressor cells constitute one group and the second data recover read scheduler configured to control a data recover read operation in the event that aggressor cells constitute two groups. The first data recover read scheduler 1320*a* controls a read operation according to a read method described with respect to FIGS. 7 and 8. That is, the first data recover read scheduler 2120*a* controls a data recover read operation performed when aggressor cells constitute one group. The second data recover read scheduler 1330*a* controls a read operation according to a read method described with respect to FIGS. 7 and 9. That is, the second data recover read scheduler 2130*a* controls a data recover read operation performed when aggressor cells constitute two groups.

The controller 2200*a* controls the non-volatile memory device 2100*a*. The controller 2200*a* may select one of the schedulers 2110*a*, 2120*a*, and 2130*a* at power-up. For example, at the power-up, the controllers 2200*a* reads data from a predetermined region of the non-volatile memory device 2100 and selects one of the schedulers 2110*a*, 2120*a*, and 2130*a* of the non-volatile memory device 2100*a* based on an error rate of the read data. This will be more fully described below.

Figure 14:
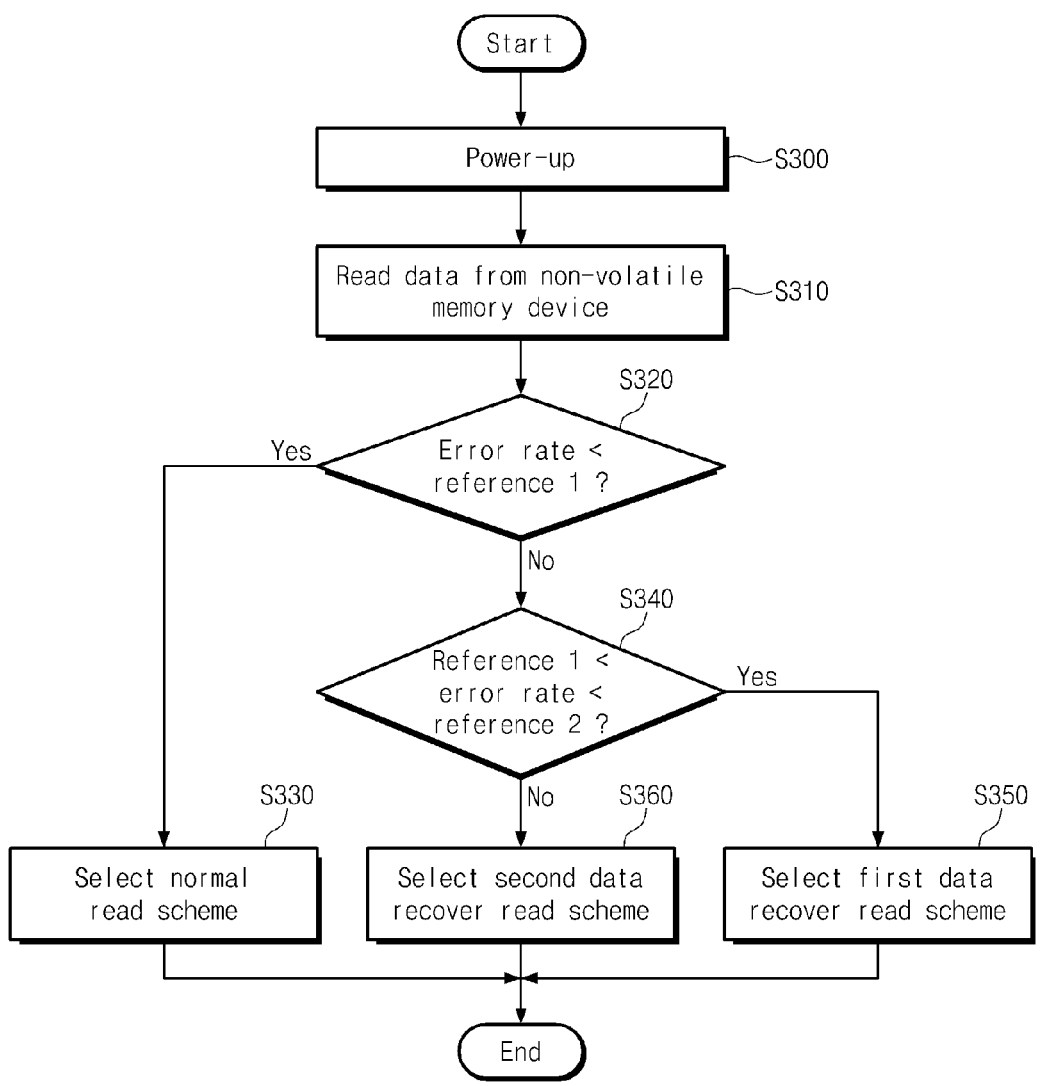
FIG. 14 is a flowchart illustrating a scheduler setting method of a controller in FIG. 13 according to an exemplary embodiment of the present general inventive concept.

FIG. 14 is a flowchart illustrating a scheduler setting method of a controller in FIG. 13 according to an exemplary embodiment of the present general inventive concept. Below, a scheduler setting method according to an exemplary embodiment of the present general inventive concept will be more fully described with reference to accompanying drawings.

In operation S300, a memory system 2000a is powered. In operation S310, a controller 2200a reads data from a predetermined region of a non-volatile memory device 2100a. The controller 2200a judges whether an error rate of the read data exceeds the first reference value. If the error rate of the read data exceeds the first reference value, the method proceeds to operation S330, in which a data recover read scheduler 2110a of the non-volatile memory device 2100a is selected under the control of the controller 2200a. Afterwards, the method proceeds to operation S370.

If the error rate of the read data does not exceed the first reference value, the method proceeds to operation S340, in which the controller 2200a judges whether the error rate of the read data exists between the first reference value and the second reference value. If whether the error rate of the read data exists between the first reference value and the second reference value, the method proceeds to operation S350. In operation S350, the first data recover read scheduler 2120a of the non-volatile memory device 2100a is selected under the control of the controller 2200a. Afterwards, the method is ended. If the error rate of the read data exceeds the second reference value, the method proceeds to operation S360. In operation S360, the second data recover read scheduler 2130a of the non-volatile memory device 2100a is selected under the control of the controller 2200a. Afterwards, the method is ended.

Following the above-described power-up sequence, the controller 2200a may judge whether an access to the non-volatile memory device 2100a is requested. If so, the requested access may be processed under the control of the controller 2200a.

In an exemplary embodiment, a coupling level may be discriminated in more detail according to an increase in an error rate. In other words, it is possible to reduce the number of error bits due to a read error by dividing aggressor cells in more detail based on the coupling level.

Figure 15:
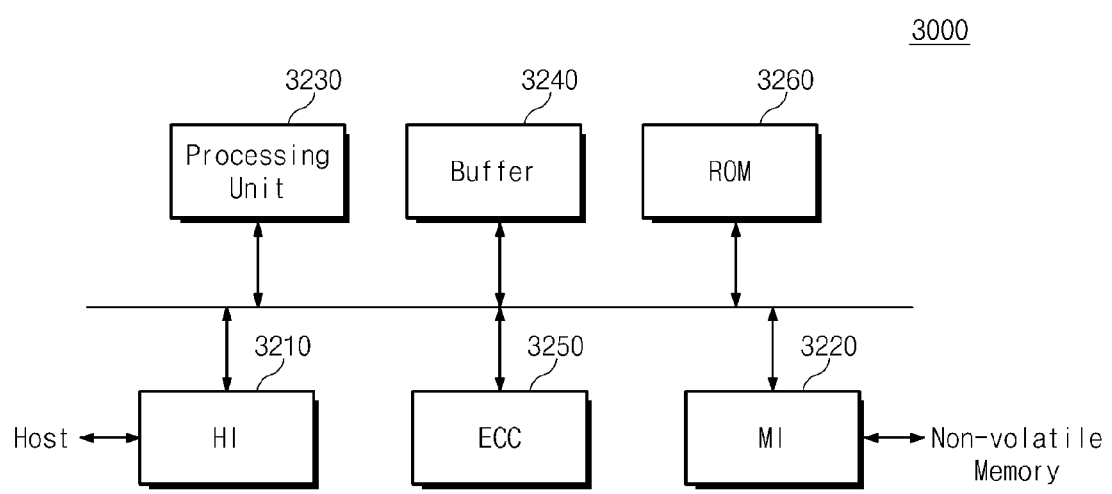
FIG. 15 is a block diagram illustrating a controller according to an exemplary embodiment of the present general inventive concept.

FIG. 15 is a block diagram illustrating a controller according to an exemplary embodiment of the present general inventive concept. A controller in FIG. 15 may correspond to one of the controllers 2200 and 2200a described with respect to FIGS. 11 to 13. Referring to FIG. 15, a controller 3000 according to an exemplary embodiment of the present general inventive concept may include the first interface (or, host interface) 3210, the second interface (or, memory interface) 3220, a processing unit 3230, a buffer 3240, an error correcting code (ECC) unit 3250, and ROM 3260.

The first interface 3210 is configured to interface with an external device (or, a host). The second interface 3220 is configured to interface with a storage media 3100 illustrated in FIG. 14. For example, the processing unit 3230, for example, CPU is configured to operate firmware such as a Flash Translation Layer (FTL). It is possible to configure the controller 3000 not to include the ROM 3260. In this case, firmware in the ROM 3260 is stored in a non-volatile memory device controlled by the controller 3000, and is loaded onto the controller 3000 from the non-volatile memory device 3000 at power-up. The buffer 3240 is used to temporarily store data transferred from the external device via the first interface 3210. The buffer 3240 is used to temporarily store data transferred from the storage media 3100 via the second interface 3220. The error correcting code (ECC) unit 3250 is configured to encode data to be stored in the storage media 3100 and to decode data read out from the storage media 3100.

At power-up, the processing unit 3230 may read data from a specific region of a non-volatile memory device, calculate an error rate of the read data and select a read scheme (including a normal read manner and a data recover read manner(s)) of the non-volatile memory device based on the error rate. As described above, the specific region of the non-volatile memory device may be determined using a mapping table managed by the firmware. But, a manner of determining a specific region of the non-volatile memory device is not limited to this disclosure.

In an exemplary embodiment, the first interface 3210 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCP-Peripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, etc.

Figure 16:
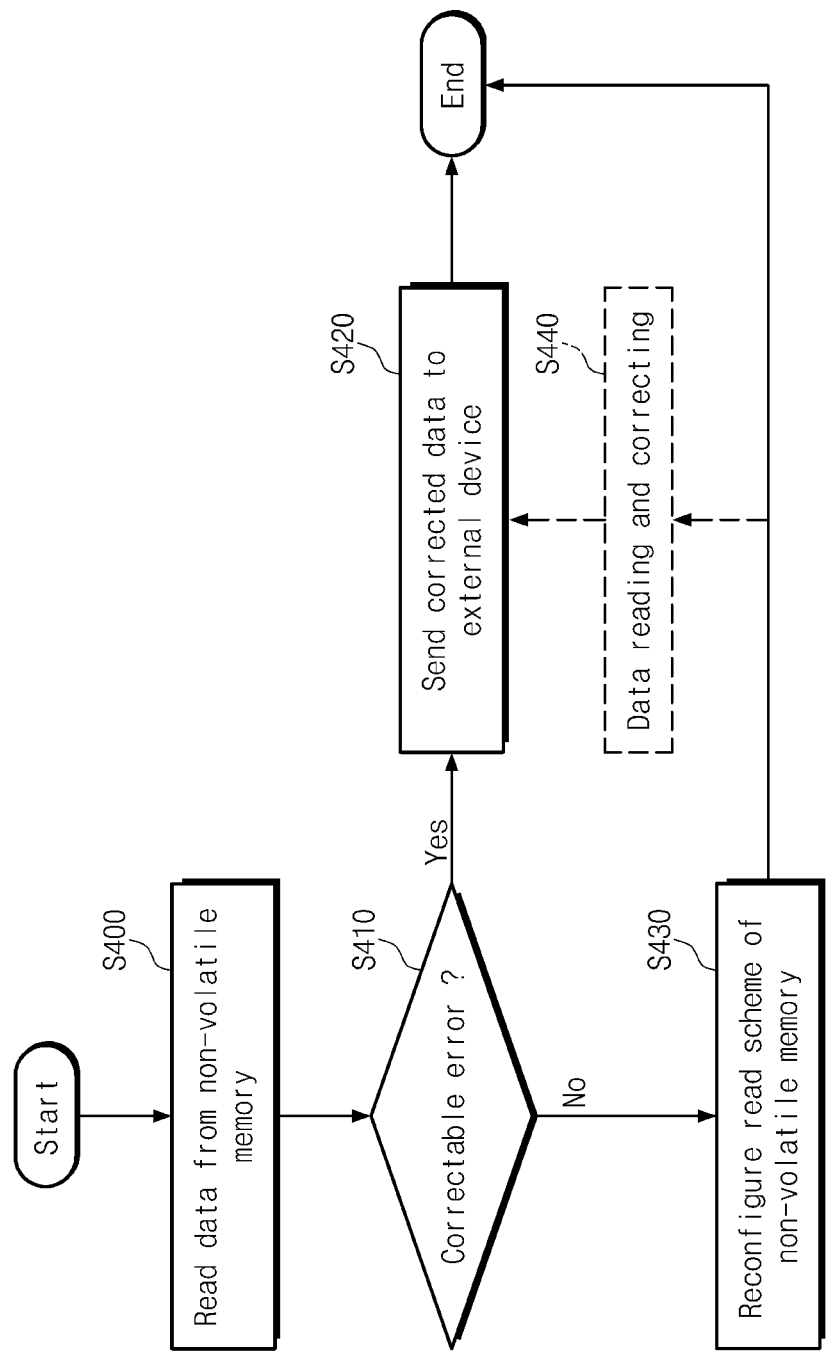
FIG. 16 is a flowchart illustrating a scheduler setting method of a controller in FIG. 13 according to another exemplary embodiment of the present general inventive concept.

FIG. 16 is a flowchart illustrating a scheduler setting method of a controller in FIG. 13 according to another exemplary embodiment of the present general inventive concept. Below, a scheduler setting method according to another exemplary embodiment of the present general inventive concept will be more fully described with reference to accompanying drawings.

In operation S400, a controller 2200a reads data from a non-volatile memory device 2100a in response to a request of an external device. Herein, a read operation of the non-volatile memory device 2100a may be executed under the assumption that a read scheme (e.g., a normal read scheme or a data recover read scheme) used by the non-volatile memory device 2100a is selected by the controller 2200a. In operation S410, the controller 2200a judges whether an error of the read data is correctable. If correctable, in operation S420, corrected data is sent to the external device. Afterwards, the method is ended.

If not correctable, the method proceeds to operation S430, in which the controller 2200a changes a read scheme of the non-volatile memory device 2100a. For example, the controller 2200a controls the non-volatile memory device 2100a such that a data recover read scheme is selected instead of a normal read scheme. Alternatively, in the event that the non-volatile memory device 2100a includes a plurality of data recover read schedulers 2120a to 2130a, the controller 2200a may control the non-volatile memory device such that one of remaining schedulers among the plurality of data recover read schedulers 2120a to 2130a other than a previously selected read scheduler. Afterwards, the method is ended.

In an exemplary embodiment, if a read scheme is changed, the controller 2200a may notice the external device that an error is generated. Alternatively, as represented by a dotted line in FIG. 16, data reading and correcting operations can be performed selectively in operation S440. That is, data is read under the control of the changed data recover read scheduler of the non-volatile memory device 2100a, and errors of the read data are corrected. In operation S420, the corrected data is sent to the external device.

Figure 17:
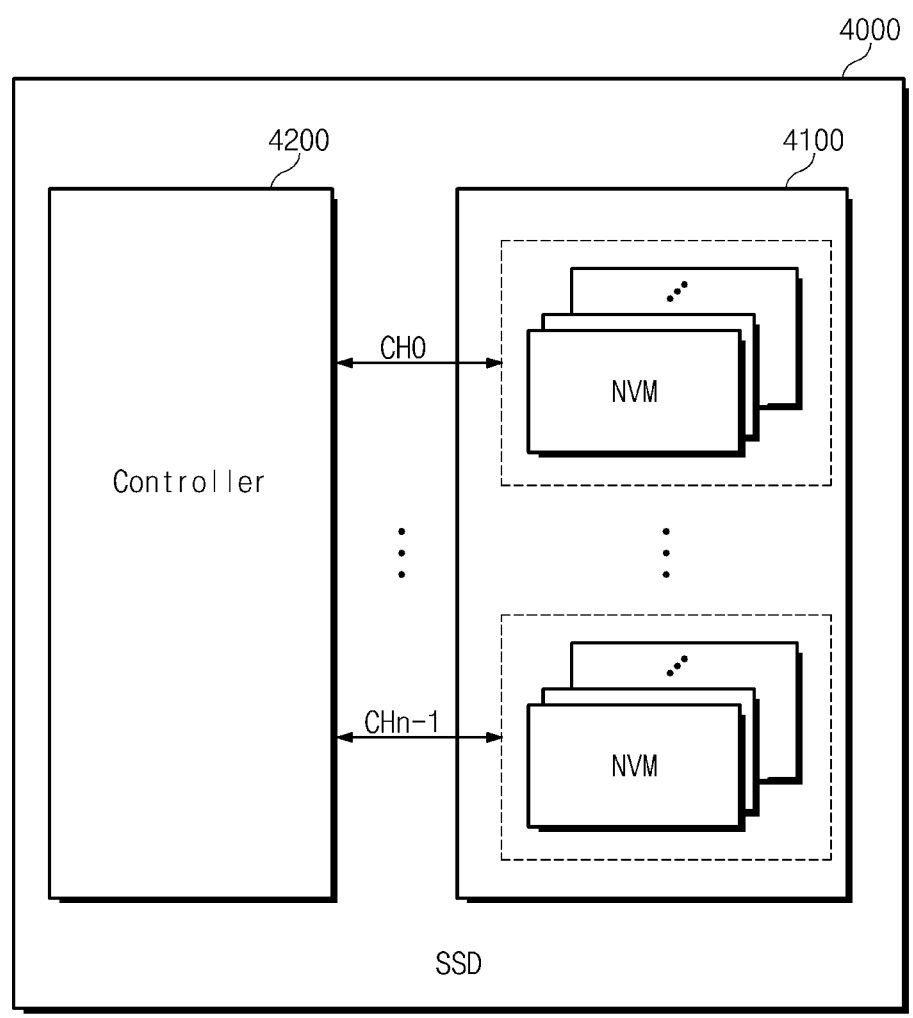
FIG. 17 is a block diagram illustrating a solid state drive using a non-volatile memory device according to exemplary embodiments of the present general inventive concept.

FIG. 17 is a block diagram illustrating a solid state drive using a non-volatile memory device according to exemplary embodiments of the present general inventive concept.

Referring to FIG. 17, a solid state drive (SSD) 4000 includes a storage media 4100 and a controller 4200. The storage media 4100 is connected with the controller 4200 via a plurality of channels, each of which is connected in common with a plurality of non-volatile memories. Each non-volatile memory device is formed of a memory which performs a read operation using a variable read scheme described with respect to FIG. 5 or 10. The controller 4200 is configured to control the storage media 4100.

Figure 18A:
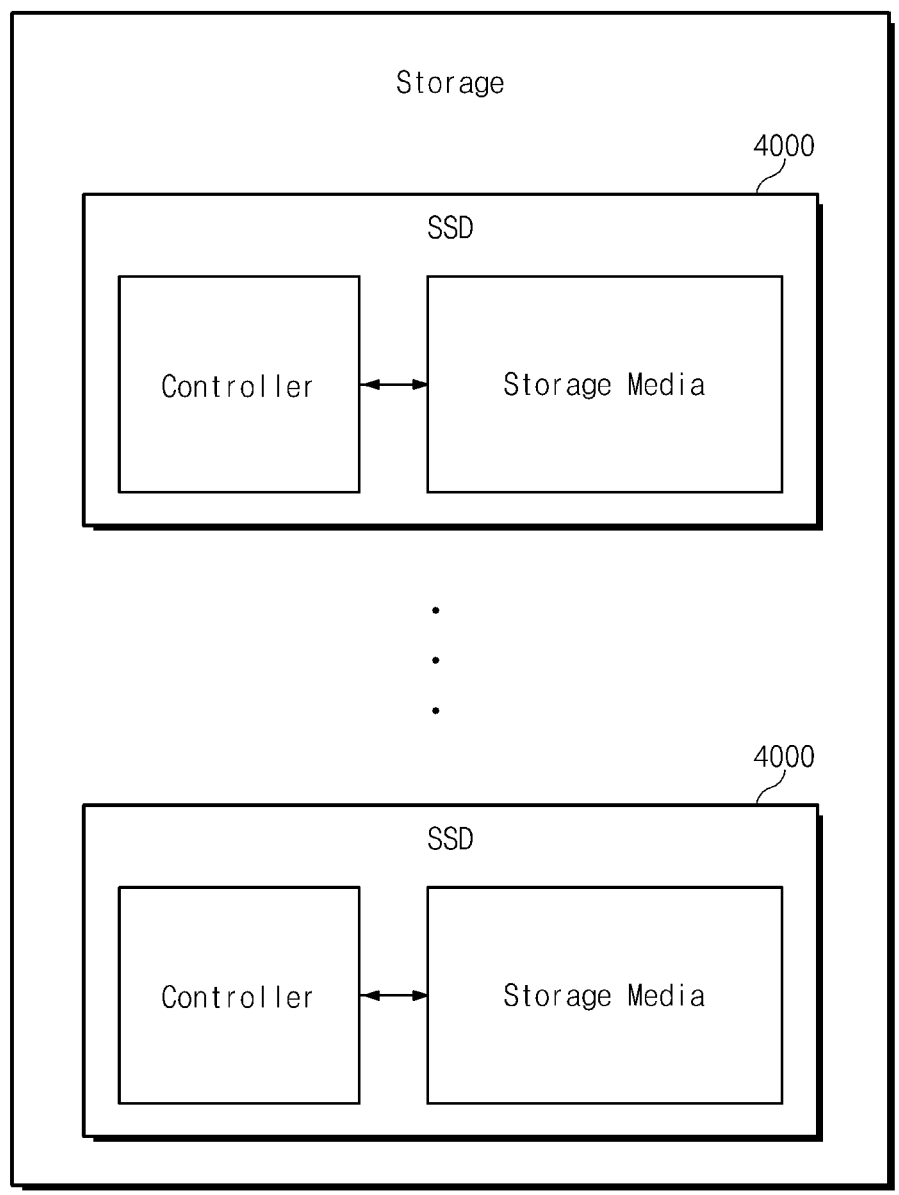
FIG. 18A is a block diagram illustrating a storage using a solid state drive in FIG. 17.
Figure 18B:
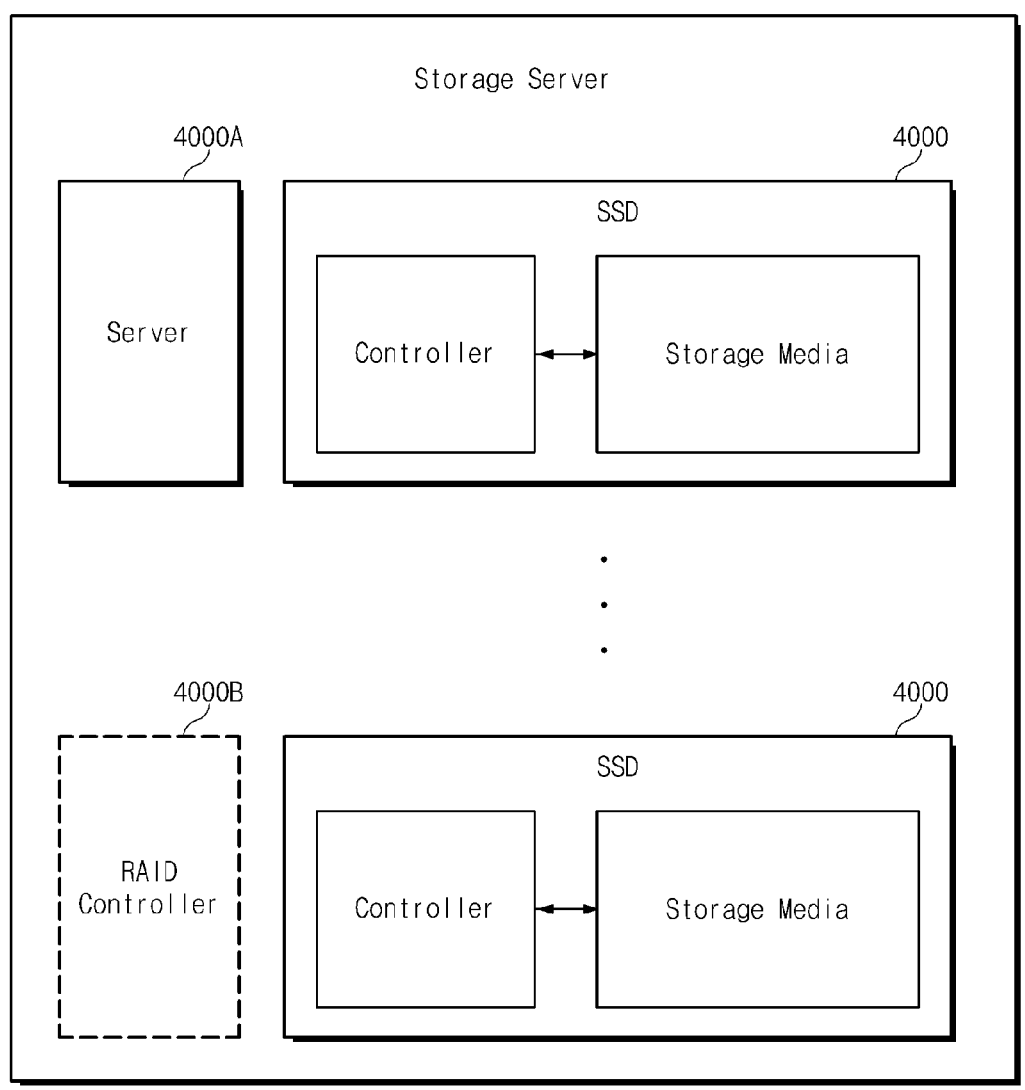
FIG. 18B is a block diagram illustrating a storage server using a solid state drive in FIG. 17.

FIG. 18A is a block diagram illustrating a storage using a solid state drive in FIG. 17, and FIG. 18B is a block diagram illustrating a storage server using a solid state drive in FIG. 17.

An SSD 4000 according to an exemplary embodiment of the present general inventive concept may be used to form the storage. As illustrated in FIG. 18A, the storage includes a plurality of solid state drives 4000 which are configured the same as described in FIG. 17. An SSD 4000 according to an exemplary embodiment of the present general inventive concept is used to configure a storage sever. As illustrated in FIG. 18B, a storage server includes a plurality of solid state drives 4000, which are configured the same as described in FIG. 17, and a server 4000A. Further, it is well comprehended that a well-known RAID controller 4000B for parity management according to a parity manner used to repair defects on data stored in the SSD 400 is provided within the storage server.

Figure 19:
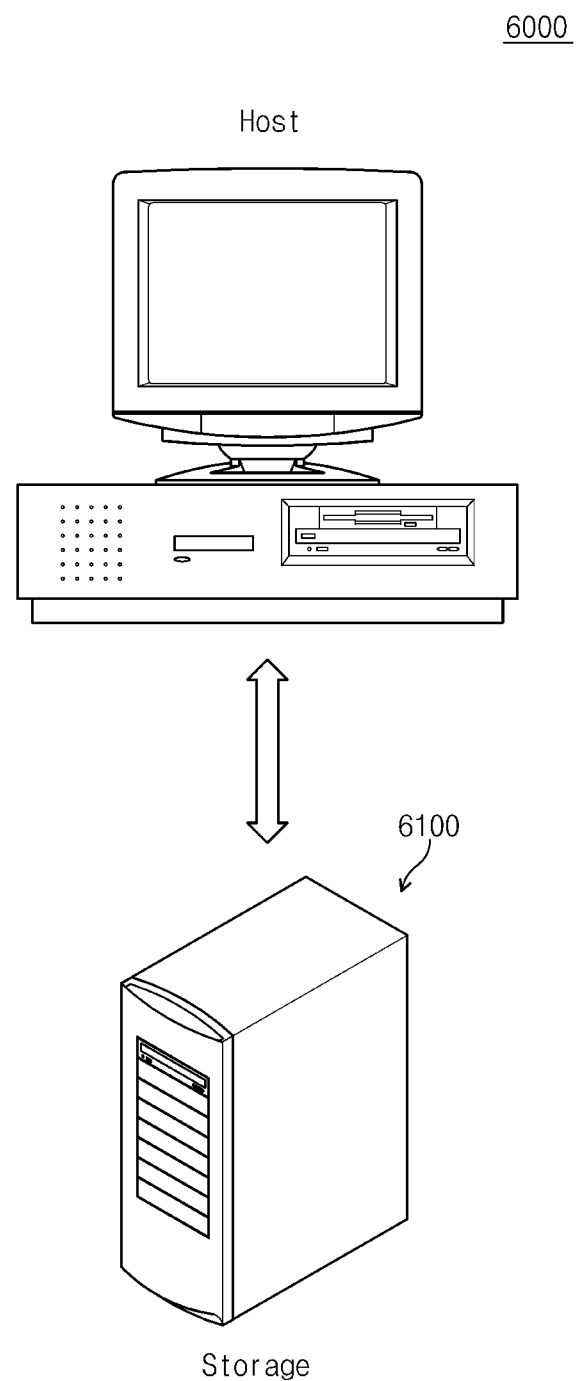
FIGS. 19 to 21 are diagrams illustrating systems to which a data storage device according to exemplary embodiments of the present general inventive concept is applied.
Figure 20:
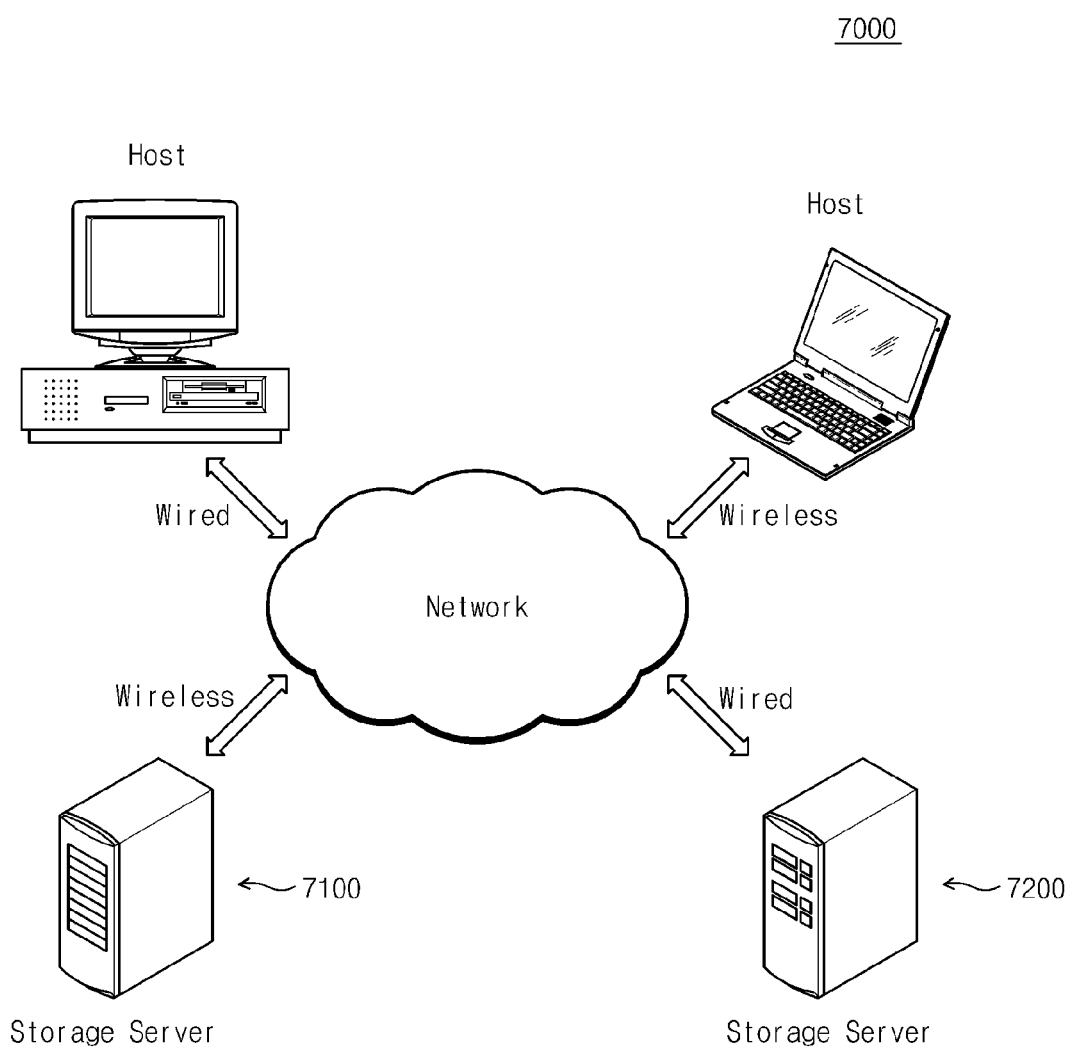
Figure 21:
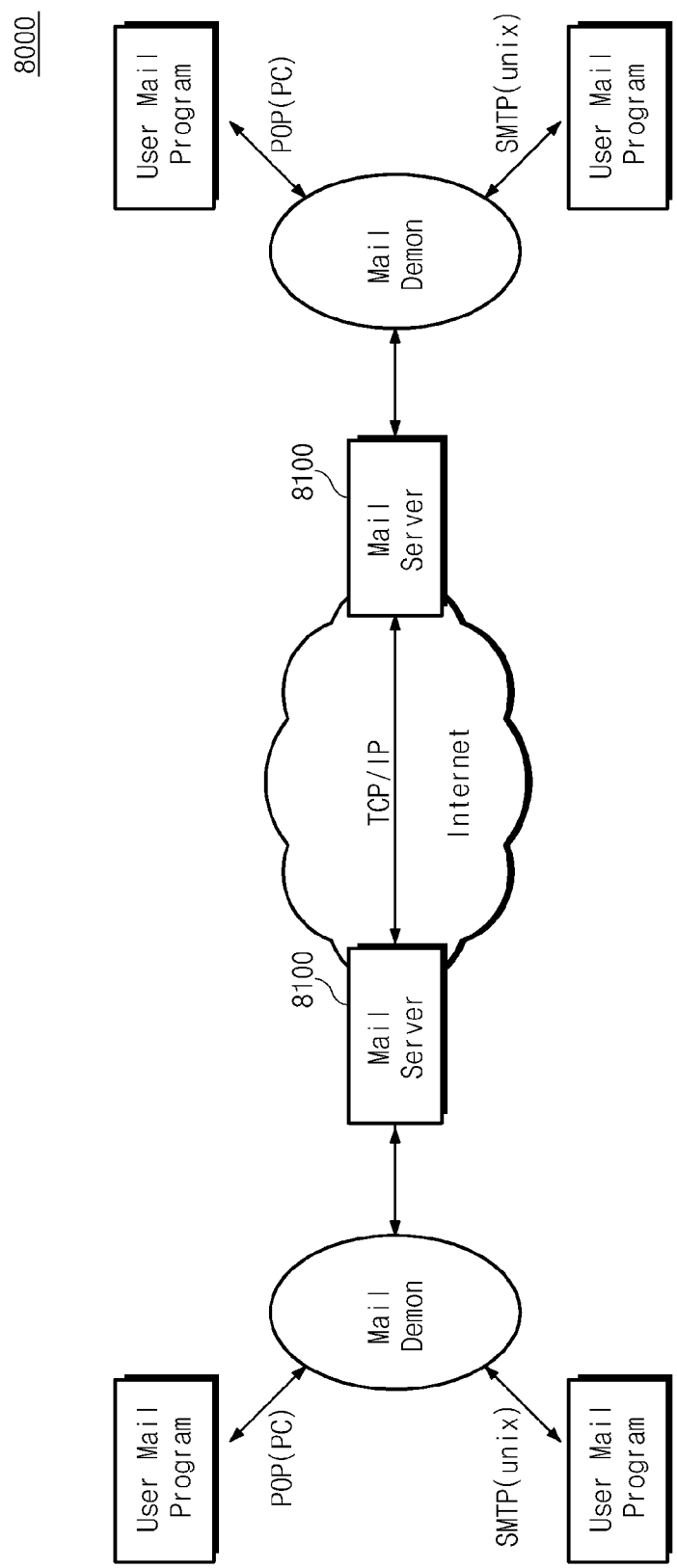

FIGS. 19 to 21 are diagrams illustrating systems to which a data storage device according to exemplary embodiments of the present general inventive concept is applied.

In the event that a solid state drive including a data storage device according to exemplary embodiments of the present general inventive concept is applied to the storage, as illustrated in FIG. 19, a system 6000 includes a storage 6100 which communicates with a host by a wire or wireless manner. In a case where a solid state drive including a data storage device according to exemplary embodiments of the present general inventive concept is applied to a storage server, as illustrated in FIG. 20, a system 7000 includes a storage servers 7100 and 7200 which communicate with a host by a wire or wireless manner. Further, as illustrated in FIG. 21, a solid state drive including a data storage device according to exemplary embodiments of the present general inventive concept can be applied to a mail server 8100. The mail server 8100 may communicate with user mail programs via a mail demon connected in POP and SMTP manners. Mail servers 8100 may communicate via an internet network.

FIGS. 22 to 26 are diagrams illustrating other systems to which a data storage device according to exemplary embodiments of the present general inventive concept is applied.

Figure 22:
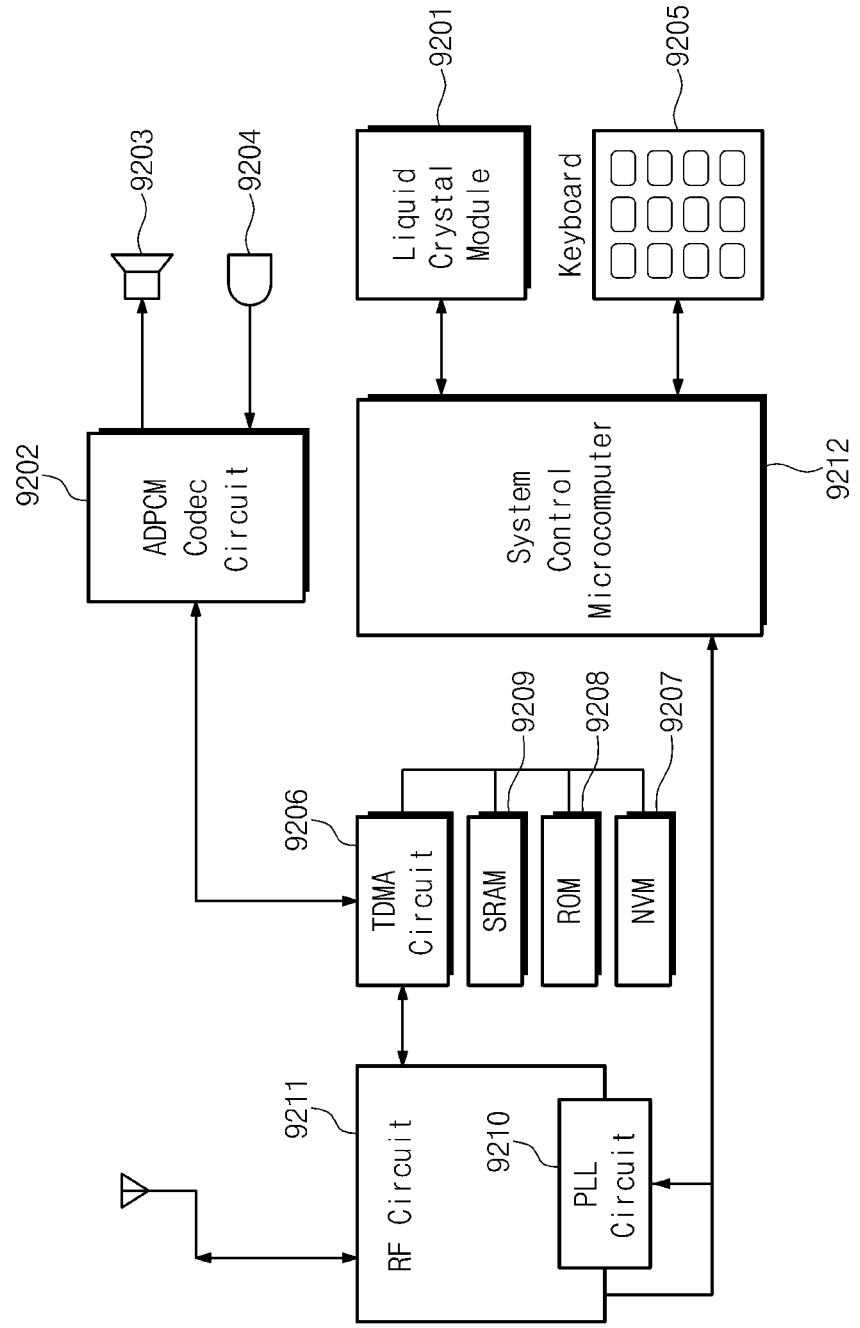
FIG. 22 is a block diagram illustrating a cellular phone system according to an exemplary embodiment of the present general inventive concept.

FIG. 22 is a block diagram illustrating a cellular phone system according to an exemplary embodiment of the present general inventive concept.

Referring to FIG. 22, a cellular phone system includes an ADPCM codec circuit 9202 to compress a voice and decompressing a compressed voice, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, and the like.

Further, the cellular phone system includes various types of memories, such as the non-volatile memory device 9207, the ROM 9208, and the SRAM 9209. The non-volatile memory device 9207 may be formed of a non-volatile memory device according to embodiments of the present general inventive concept. The ROM 9208 is used to store programs, and the SRAM 9209 is used as a work region for the system control microcomputer 9212 or/and to temporarily store data. Herein, the system control microcomputer 9212 is a processor which is configured to control write and read operations of the non-volatile memory device 9207.

Figure 23:
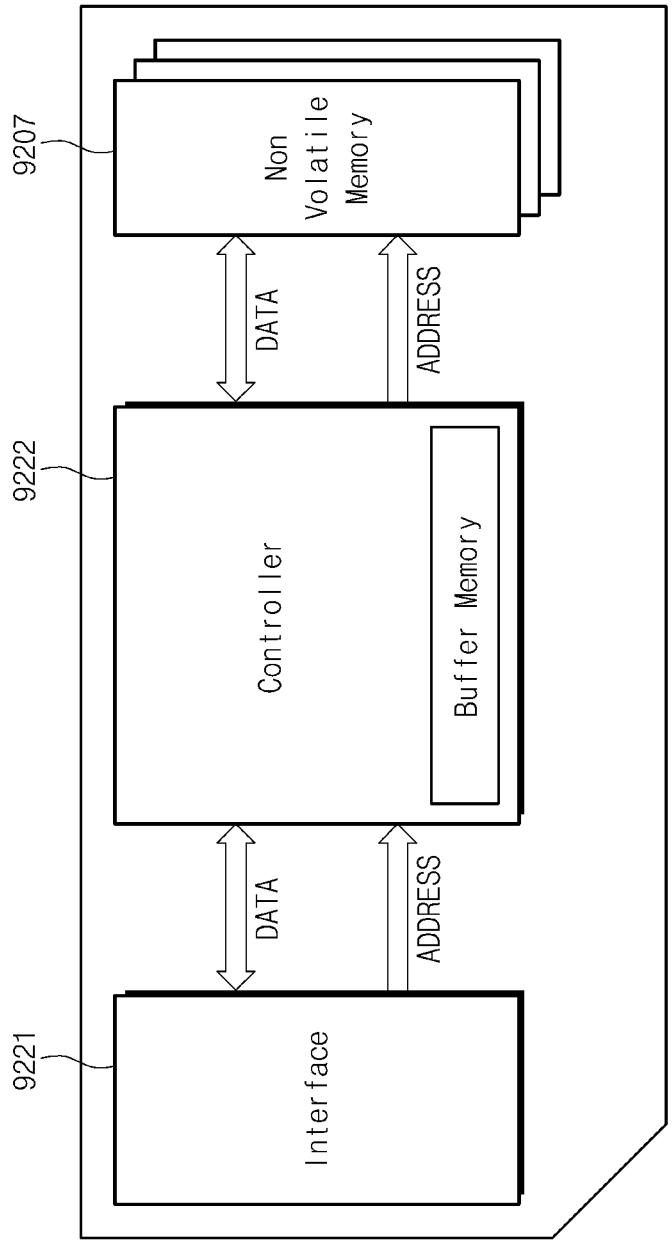
FIG. 23 is a block diagram illustrating a memory card according to embodiments of the present general inventive concept.

FIG. 23 is a block diagram illustrating a memory card according to embodiments of the present general inventive concept. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 23, the memory card includes an interface circuit 9221 to interface with an external device, a controller 9222 including a buffer memory and controlling an operation of the memory card, and at least one non-volatile memory device 9207 according to embodiments of the present general inventive concept. The controller 9222 is a processor which is configured to control write and read operations of the non-volatile memory device 9207. In particular, the controller 9222 is coupled with the non-volatile memory device 9207 and the interface circuit 2221 via a data bus and an address bus.

Figure 24:
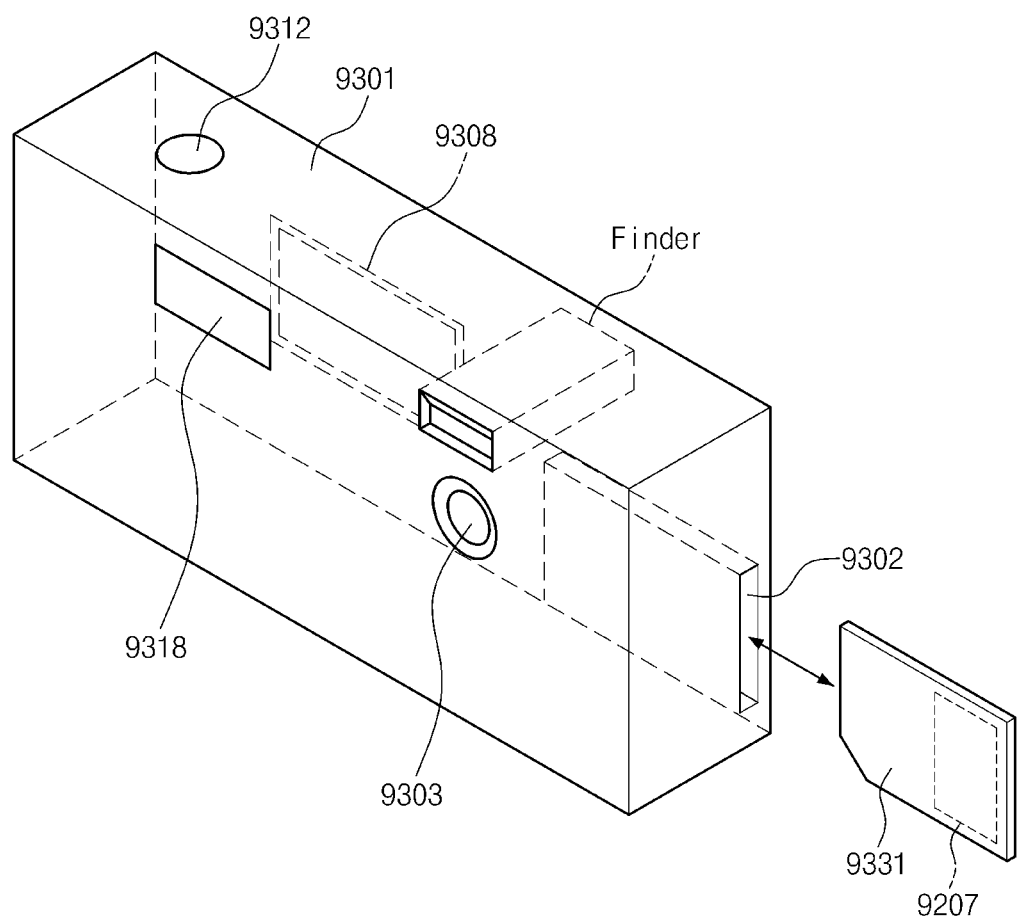
FIG. 24 is a block diagram illustrating a digital still camera according to an exemplary embodiment of the present general inventive concept.

FIG. 24 is a block diagram illustrating a digital still camera according to an exemplary embodiment of the present general inventive concept.

Referring to FIG. 24, a digital still camera includes a body 9301, a slot 9302, a lens 9303, a display circuit 9308, a shutter button 9312, a strobe 9318, and the like. In particular, a memory card 9331 is inserted in the slot 9308 and includes at least one non-volatile memory device 9207 according to embodiments of the present general inventive concept.

If the memory card 9331 has a contact type, an electric circuit on a circuit board is electrically contacted with the memory card 9331 when it is inserted in the slot 9308. In the event that the memory card 9331 has a non-contact type, an electric circuit on a circuit board communicates with the memory card 9331 in a radio-frequency manner.

Figure 25:
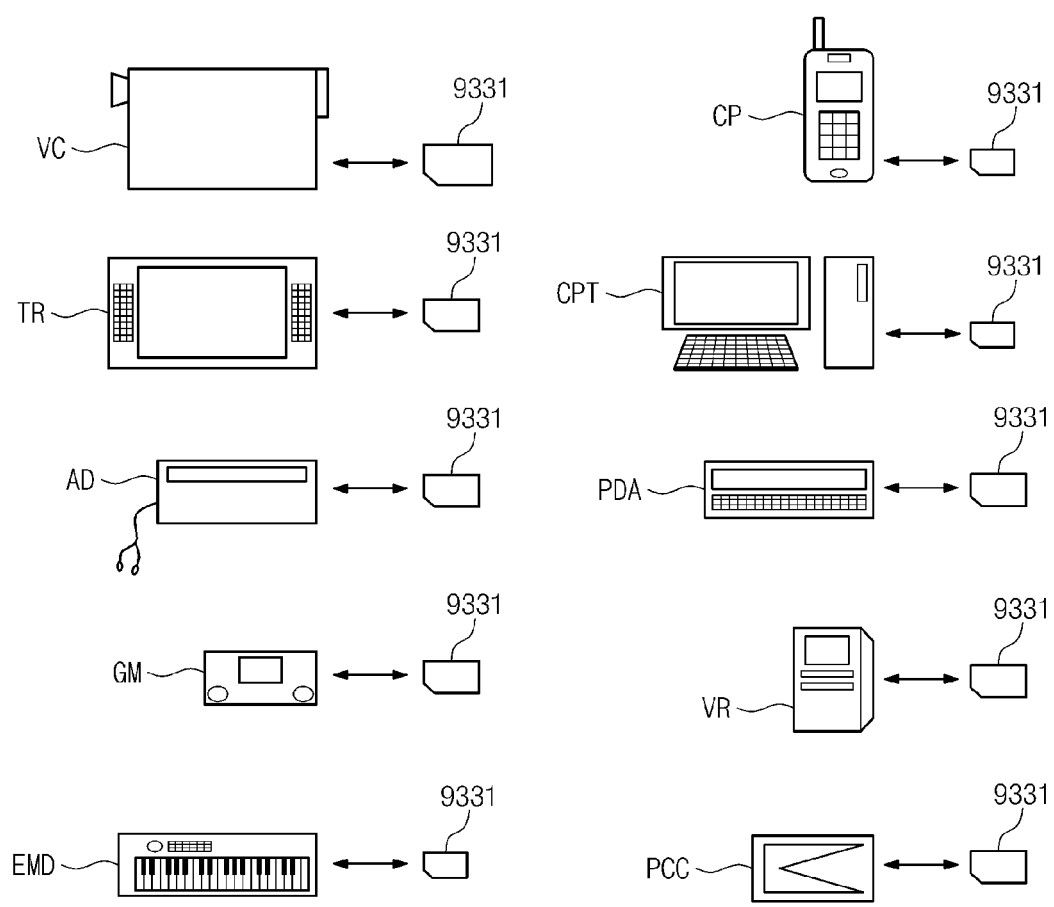
FIG. 25 is a diagram illustrating various systems to which a memory card in FIG. 23 is applied.

FIG. 25 is a diagram illustrating various systems to which a memory card in FIG. 23 is applied.

Referring to FIG. 25, a memory card 9331 may be applied to a video camera VC, a television TV, an audio device AD, a game machine GM, an electronic music device EMD, a cellular phone CP, a computer CPT, a personal digital assistant PDA, a voice recorder VR, a PC card PCC, and the like.

Figure 26:
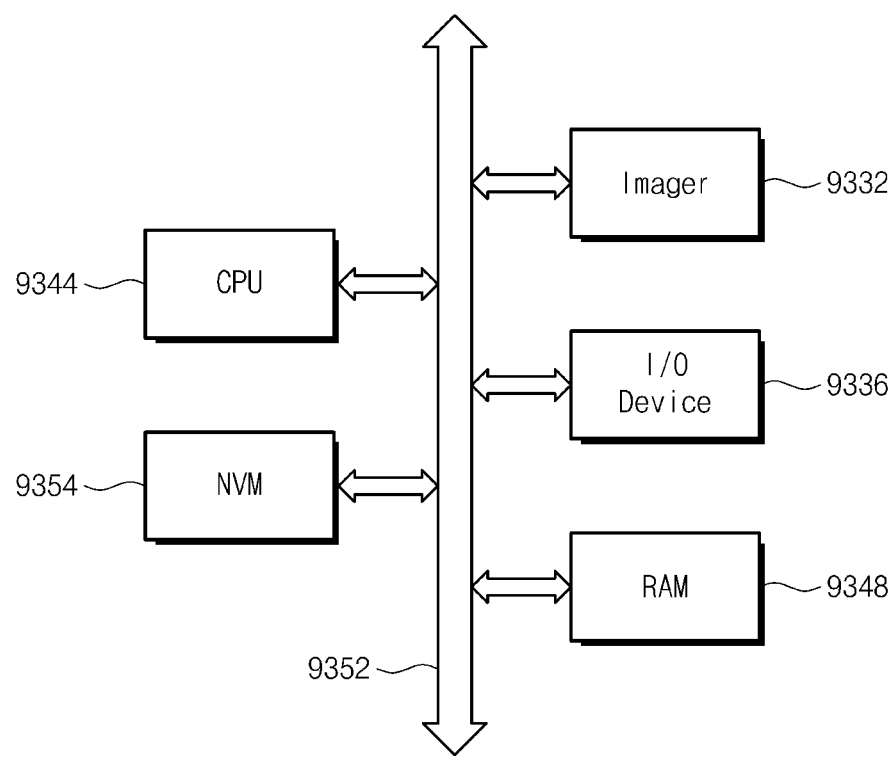
FIG. 26 is a block diagram illustrating an image sensor system according to an exemplary embodiment of the present general inventive concept.

FIG. 26 is a block diagram illustrating an image sensor system according to an exemplary embodiment of the present general inventive concept.

Referring to FIG. 26, an image sensor system includes an image sensor 9332, an input/output device 9336, RAM 9348, CPU 9344, and a non-volatile memory device 9354 according to embodiments of the present general inventive concept. Elements in FIG. 26 communicate with one another via a bus 9352. The image sensor 9332 may include a photo sensing device such as a photo-gate, photo-diode, or the like. Elements in FIG. 26 may be formed of a single chip together with a processor or independently from the processor.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A non-volatile memory device comprising:
   a memory cell array having memory cells arranged in rows and columns;
   a page buffer circuit configured to read data from the memory cell array; and
   a control logic and input/output interface block including a normal read scheduler controlling a normal read operation and a data recover read scheduler controlling a data recover read operation and configured to control the page buffer circuit at a read request,
   wherein one of the normal read scheduler and the data recover read scheduler is selected according to selection information provided from an external device.

2. The non-volatile memory device of claim 1, wherein selecting of one of the normal read scheduler and the data recover read scheduler is made in an on-the-fly manner at power-up.

3. The non-volatile memory device of claim 2, wherein the page buffer circuit comprises a plurality of page buffers each corresponding to the columns of the memory cell array, and
   wherein each of the page buffers includes an N-bit latch (N being an integer of 1 or more) which is set according to data read out from memory cells in a row adjacent to a read-requested row at the data recover read operation.

4. The non-volatile memory device of claim 3, wherein the memory cells in the adjacent row include aggressor cells to force word line coupling to memory cells in the read-requested row, the aggressor cells constituting one or more aggressor cell groups.

5. The non-volatile memory device of claim 4, wherein each of the memory cells stores 3-bit data and is programmed to have one of an erase state and a first to a seventh program state.

6. The non-volatile memory device of claim 5, wherein memory cells having the first, third, fifth and seventh program states among the memory cells in the adjacent row constitute a group of aggressor cells forcing word line coupling to the memory cells in the selected row.

7. The non-volatile memory device of claim 6, wherein N-bit latches of page buffers corresponding to first memory cells in the group of aggressor cells among the memory cells of the adjacent row are set to a first logic state according to data read from the first memory cells, and N-bit latches of page buffers corresponding to second memory cells among the memory cells of the adjacent row are set to a second logic state according to data read from the second memory cells.

8. The non-volatile memory device of claim 5, wherein memory cells having the first program state as the lowest program state among the memory cells of the adjacent row constitute a first aggressor cell group forcing word line coupling to the memory cells of the selected row at the data recover read operation, and memory cells having the second to seventh program states among the memory cells of the adjacent row constitute a second aggressor cell group forcing word line coupling to the memory cells of the selected row at the data recover read operation.

9. The non-volatile memory device of claim 8, wherein N-bit latches of page buffers corresponding to first memory cells in the first aggressor cell group among the memory cells of the adjacent row are set to a first logic state according to data read from the first memory cells, N-bit latches of page buffers corresponding to second memory cells in the second aggressor cell group among the memory cells of the adjacent row are set to a second logic state according to data read from the second memory cells, and N-bit latches of page buffers corresponding to the remaining memory cells among the memory cells of the adjacent row are set to a second logic state according to data read from the remaining memory cells.

10. A non-volatile memory device comprising:
    a memory cell array having memory cells arranged in rows and columns and programmed to have one of an erase state and a first to a seventh program state;
    a page buffer circuit configured to read data from the memory cell array; and
    a control logic and input/output interface block controlling the page buffer circuit to perform a data recover read operation at an access request,
    wherein at least one of the first to seventh program states is judged with a negative voltage being applied to a selected row; and
    wherein memory cells having at least three or more ones of the first to seventh program states among memory cells in an upper row adjacent to the selected row constitute a group of aggressor cells forcing word line coupling to memory cells of the selected row.

11. The non-volatile memory device of claim 10, wherein the page buffer circuit comprises a plurality of page buffers each corresponding to the columns of the memory cell array, and
    wherein each of the page buffers includes an N-bit latch (N being an integer of 1 or more) which is set according to data read out from memory cells in a row adjacent to a read-requested row at the data recover read operation.

12. The non-volatile memory device of claim 11, wherein N-bit latches of page buffers corresponding to first memory cells in the group of aggressor cells among the memory cells of the adjacent row are set to a first logic state according to data read from the first memory cells, and N-bit latches of page buffers corresponding to second memory cells among the memory cells of the adjacent row are set to a second logic state according to data read from the second memory cells.

13. The non-volatile memory device of claim 12, wherein the data recover read operation is accomplished by performing a read operation on the selected row via page buffers corresponding to N-bit latches set to the first logic state and performing a read operation on the selected row via page buffers corresponding to N-bit latches set to the second logic state.

14. The non-volatile memory device of claim 13, wherein columns of the page buffers corresponding to N-bit latches set to the first logic state are grounded when the read operation on the selected row is performed via page buffers corresponding to N-bit latches set to the first logic state, and
    wherein columns of the page buffers corresponding to N-bit latches set to the second logic state are grounded when the read operation on the selected row is performed via page buffers corresponding to N-bit latches set to the second logic state.

15. The non-volatile memory device of claim 10, wherein the at least three or more ones of the first to seventh program states include the first, third, fifth, and seventh program states.

16. A read method of a non-volatile memory device which includes multi-bit memory cells arranged in rows and columns, the read method comprising:
   judging whether a data recover read scheme is selected;
   reading data from memory cells in a read-requested row according to the data recover read scheme when the data recover read scheme is selected; and
   reading data from the memory cells in the read-requested row according to a normal read scheme when the data recover read scheme is not selected,
   wherein selecting of the data recover read scheme is made by selection information provided from an external device.

17. The read method of claim 16, wherein each of the memory cells stores 3-bit data and is programmed to have one of an erase state and a first to a seventh program states.

18. The read method of claim 17, wherein at least one of the first to seventh program states is judged with a negative voltage being applied to the read-requested row; and
   wherein memory cells having the first, third, fifth, and seventh program states among memory cells in a row adjacent to the read-requested row constitute a group of aggressor cells forcing word line coupling to memory cells of the read-requested row.

19. The read method of claim 18, wherein the non-volatile memory device further comprises a page buffer circuit configured to read data from the memory cell array,
   wherein the page buffer circuit comprises a plurality of page buffers each corresponding to the columns of the memory cell array, and
   wherein each of the page buffers includes an N-bit latch (N being an integer of 1 or more) which is set according to data read out from memory cells in the row adjacent to the read-requested row at the data recover read operation.

20. The read method of claim 19, wherein N-bit latches of page buffers corresponding to first memory cells in the group of aggressor cells among the memory cells of the adjacent row are set to a first logic state according to data read from the first memory cells, and N-bit latches of page buffers corresponding to second memory cells among the memory cells of the adjacent row are set to a second logic state according to data read from the second memory cells.

21. The read method of claim 16, wherein selecting of the data recover read operation is performed by a controller to control the non-volatile memory device.

22. The read method of claim 21, wherein the controller makes selecting of the data recover read scheme based on an error rate of data read from a specific area of the non-volatile memory device.

23. The read method of claim 21, wherein the controller makes selecting of the data recover read scheme in an on-the-fly manner based on an error rate of data read from a specific area of the non-volatile memory device.

24. A read method of a non-volatile memory device which includes multi-bit memory cells arranged in rows and columns, the read method comprising:
   judging whether one of a plurality of data recover read schemes is selected;
   when one of a plurality of data recover read schemes is selected, reading data from memory cells in a read-requested row according to the selected data recover read scheme; and
   when one of a plurality of data recover read schemes is not selected, reading from the memory cells in the read-requested row according to a normal read scheme,
   wherein selecting of the data recover read schemes is made by an external device.

25. The read method of claim 24, wherein each of the memory cells stores 3-bit data and is programmed to have one of an erase state and a first to a seventh program states.

26. The read method of claim 25, wherein memory cells having the first, third, fifth, and seventh program states among memory cells in a row adjacent to the read-requested row constitute a group of aggressor cells forcing word line coupling to memory cells of the read-requested row.

27. The read method of claim 25, wherein memory cells having the first program state among the memory cells in the read-requested row constitute a first aggressor cell group forcing word line coupling to the memory cells in the read-requested row at a data recover read operation executed according to one of the data recover read schemes, and memory cells having the second to seventh program states among the memory cells in the read-requested row constitute a first aggressor cell group forcing word line coupling to the memory cells in the read-requested row at the data recover read operation.

28. A memory card comprising:
   a non-volatile memory device having memory cells arranged in rows and columns; and
   a controller having a buffer memory to store data read from the non-volatile memory device and configured to control the non-volatile memory device,
   wherein the non-volatile memory device includes a normal read scheduler and a data recover read scheduler selected according to a control of the controller and performs a read operation corresponding to a request of the controller according to the selected read scheduler.

29. The memory card of claim 28, wherein each of the memory cells is programmed to have one of an erase state and a first to a seventh program state,
   wherein at least one program state of the first to seventh program states is judged with a negative voltage being applied to a selected row, and
   wherein memory cells having the first, third, fifth, and seventh program states among memory cells of an upper row adjacent to the selected row constitute a group of aggressor cells forcing word line coupling to memory cells of the selected row.

30. A solid state drive comprising:
   a storage media having a plurality of non-volatile memory devices; and
   a controller communicating with the storage media via a plurality of channels, wherein each of the plurality of non-volatile memory devices comprises a memory cell array having memory cells arranged in rows and columns and programmed to have one of an erase state and a first to a seventh program state;
   a page buffer circuit configured to read data from the memory cell array; and
   a control logic and input/output interface block controlling the page buffer circuit to perform a data recover read operation at an access request,
   wherein at least one program state of the first to seventh program states is judged with a negative voltage being applied to a selected row, and
   wherein memory cells having the first, third, fifth, and seventh program states among memory cells of an upper row adjacent to the selected row constitute a group of aggressor cells forcing word line coupling to memory cells of the selected row at the data recover read operation.

31. The solid state drive of claim 30, wherein the page buffer circuit comprises a plurality of page buffers each corresponding to the columns of the memory cell array, and
wherein each of the page buffers includes an N-bit latch (N being an integer of 1 or more) which is set according to data read out from memory cells in a row adjacent to a read-requested row at the data recover read operation.

32. The solid state drive of claim 31, wherein N-bit latches of page buffers corresponding to first memory cells in the group of aggressor cells among the memory cells of the adjacent row are set to a first logic state according to data read from the first memory cells, and N-bit latches of page buffers corresponding to second memory cells among the memory cells of the adjacent row are set to a second logic state according to data read from the second memory cells.

33. The solid state drive of claim 32, wherein the data recover read operation is accomplished by performing a read operation on the selected row via page buffers of N-bit latches set to the first logic state and a read operation on the selected row via page buffers of N-bit latches set to the second logic state.

34. A non-volatile memory device comprising:
a memory cell array having memory cells arranged in rows and columns;
a page buffer circuit configured to read data from the memory cell array; and
a control logic and input/output interface block including a normal read scheduler controlling a normal read operation and a plurality of data recover read schedulers controlling different data recover read operations and configured to control the page buffer circuit at a read request,
wherein one of the normal read scheduler and the plurality of data recover read schedulers is selected according to selection information provided from an external device.

35. The non-volatile memory device of claim 34, wherein the selection information is determined according to an error rate of data read from the memory cell array at power-up, and the plurality of data recover read schedulers includes a first and a second data recover read scheduler,
the first data recover read scheduler being selected by the selection information when the error rate exists between a first reference value and a second reference value, and
the second data recover read scheduler being selected by the selection information when the error rate exceeds the second reference value.

36. The non-volatile memory device of claim 35, wherein each of the memory cells stores 3-bit data and is programmed to have one of an erase state and a first to a seventh program states.

37. The non-volatile memory device of claim 36, wherein memory cells having the first program state as the lowest program state among the memory cells of a row adjacent to the selected row constitute a first aggressor cell group forcing word line coupling to the memory cells of the selected row at the data recover read operation, and memory cells having the second to seventh program states among the memory cells of the adjacent row constitute a second aggressor cell group forcing word line coupling to the memory cells of the selected row.

38. The non-volatile memory device of claim 37, wherein the first data recover read scheduler is configured to control a data recover read operation on the first aggressor cell group, and the second data recover read scheduler is configured to control a data recover read operation on the first and second aggressor cell groups.

39. A solid state drive comprising:
a storage media having a plurality of non-volatile memory devices; and
a controller communicating with the storage media via a plurality of channels,
wherein each of the plurality of non-volatile memory devices comprises:
a memory cell array having memory cells arranged in rows and columns;
a page buffer circuit configured to read data from the memory cell array; and
a control logic and input/output interface block including a normal read scheduler controlling a normal read operation and a first and a second data recover read schedulers controlling different data recover read operations and configured to control the page buffer circuit at a read request,
wherein the controller determines selection information based on an error rate of data read from the memory cell array,
wherein one of the normal read scheduler and the first and second read schedulers is selected according to the selection information, and
wherein the first data recover read scheduler is selected by the selection information when the error rate exists between a first reference value and a second reference value, and the second data recover read scheduler is selected by the selection information when the error rate exceeds the second reference value.

40. The solid state drive of claim 39, wherein each of the memory cells stores 3-bit data and programmed to have one of an erase state and a first to a seventh program states.

41. The solid state drive of claim 40, wherein memory cells having the first program state as the lowest program state among the memory cells of a row adjacent to a selected row constitute a first aggressor cell group forcing word line coupling to the memory cells of the selected row at the data recover read operation, and memory cells having the second to seventh program states among the memory cells of the adjacent row constitute a second aggressor cell group forcing word line coupling to the memory cells of the selected row.

42. The solid state drive of claim 41, wherein the first data recover read scheduler is configured to control a data recover read operation on the first aggressor cell group, and the second data recover read scheduler is configured to control a data recover read operation on the first and second aggressor cell groups.

43. The solid state drive of claim 41, wherein one of the normal read scheduler and the first and second data recover read schedulers is selected in an on-the-fly manner at power-up.

44. An operating method of a memory controller which controls a non-volatile memory device, the operating method comprising:
judging an error rate of data read from the non-volatile memory device; and
changing a read scheme of the non-volatile memory device according to the judgment,
wherein the read scheme includes a normal read scheme and one or more data recover read schemes, and wherein the read scheme is changed at power-up or in use of the non-volatile memory device.

45. A method of reading data from memory cells that store multi-bit data, the method comprising:
reading data from a region of a non-volatile memory device, the region having a plurality of word lines and bit lines to define memory cells;

determining whether memory cells in an nth word line have coupled and uncoupled voltage distributions, the coupled distributions being caused by programming memory cells of an (n+1)th word line; and executing a plurality of read operations on the memory cells of the nth word line to reduce a read error of the nth word line, where n is an integer 1.

46. The method of claim 45, wherein the determining whether the voltage distributions of memory cells of the nth word line are coupled comprises judging whether an error rate of the read data exceeds a reference value.

47. The method of claim 45, wherein the coupling of memory cells of the nth word line is based on a threshold voltage shift caused by the programming of memory cells of the (n+1)th word line.

48. The method of claim 47, wherein the number of the plurality of read operations is the same as the number of threshold voltage shifts caused by the programming the memory cells of the (n+1)th word line.

49. The method of claim 45, further comprising:

reading the uncoupled memory cells using a first read voltage; and reading the coupled memory cells using a second read voltage different from the first read voltage.

50. The method of claim 45, wherein the multi-bit data is 3-bit data stored in a single memory cell.

* * * * *